United States Patent
Sugishita et al.

(10) Patent No.: US 8,417,394 B2
(45) Date of Patent: Apr. 9, 2013

(54) SUBSTRATE PROCESSING APPARATUS, SEMICONDUCTOR DEVICE MANUFACTURING METHOD AND TEMPERATURE CONTROLLING METHOD

(75) Inventors: Masashi Sugishita, Toyama (JP); Masaaki Ueno, Toyama (JP); Tsukasa Iida, Toyama (JP); Susumu Nishiura, Toyama (JP); Masao Aoyama, Toyama (JP); Kenichi Fujimoto, Toyama (JP); Yoshihiko Nakagawa, Toyama (JP); Hiroyuki Mitsui, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 831 days.

(21) Appl. No.: 12/609,541

(22) Filed: Oct. 30, 2009

(65) Prior Publication Data

US 2010/0124726 A1 May 20, 2010

(30) Foreign Application Priority Data

Nov. 14, 2008 (JP) .................................. 2008-292284

(51) Int. Cl.
*H01L 21/67* (2006.01)
(52) U.S. Cl. ......... 700/300; 432/239; 432/241; 432/247
(58) Field of Classification Search .................. 432/239, 432/241, 247; 118/666, 667, 712, 665, 52, 118/612, 319, 320
See application file for complete search history.

(56) References Cited

U.S. PATENT DOCUMENTS

| | | | | |
|---|---|---|---|---|
| 5,961,323 A * | 10/1999 | Lee | .................................. | 432/241 |
| 6,496,749 B1 * | 12/2002 | Yamaguchi et al. | .......... | 700/121 |
| 6,901,317 B2 * | 5/2005 | Starner | ......................... | 700/299 |
| 6,911,628 B1 * | 6/2005 | Hirayama | ..................... | 219/486 |
| 7,577,493 B2 * | 8/2009 | Sugishita et al. | ............. | 700/207 |
| 7,625,604 B2 * | 12/2009 | Suzuki et al. | ............ | 427/255.28 |
| 2006/0099805 A1 * | 5/2006 | Fujita et al. | ................... | 438/660 |
| 2009/0078197 A1 * | 3/2009 | Takenaga et al. | ............. | 118/708 |

FOREIGN PATENT DOCUMENTS

| | | |
|---|---|---|
| JP | 2003-109906 | 4/2003 |
| JP | 2009-81260 | 4/2009 |
| WO | 2006/070552 A1 | 7/2006 |

* cited by examiner

*Primary Examiner* — Steven B McAllister
*Assistant Examiner* — Ko-Wei Lin
(74) *Attorney, Agent, or Firm* — Brundidge & Stanger, P.C.

(57) ABSTRACT

Provided are a substrate processing apparatus, a semiconductor device manufacturing method, and a temperature controlling method, which are adapted to improve equipment operational rate. A calculation parameter computing unit computes a calculation parameter using at least a first calculation parameter correction value determined by a first calculation parameter setting unit based on an accumulated film thickness on a reaction vessel, a second calculation parameter correction value determined by a second calculation parameter setting unit based on an accumulated film thickness on a filler wafer, and a third calculation parameter correction value determined by a third calculation parameter setting unit based on the number of filler wafers. Product and filler wafers are accommodated and heat-treated in the reaction vessel while controlling a heating unit using calculation results obtained using at least the calculation parameter and deviation between a set temperature and a temperature detected in the heating unit by a temperature detector.

12 Claims, 14 Drawing Sheets

| No. | BASE P CONSTANT (%) | FILM THICKNESS (nm) | ACCUMULATED P CONSTANT CORRECTION VALUE (%) | | | | |
|---|---|---|---|---|---|---|---|
| | | | U | CU | C | CL | L |
| 1 | 50 | 1500 | 0 | 20 | 20 | 20 | 0 |
| 2 | | 3000 | 0 | 10 | 10 | 10 | 0 |
| 3 | | 10000 | 0 | 0 | 0 | 0 | 0 |

| No. | BASE P CONSTANT (%) | FILM THICKNESS (nm) | FD ACCUMULATED P CONSTANT CORRECTION VALUE (%) | | | | |
|---|---|---|---|---|---|---|---|
| | | | U | CU | C | CL | L |
| 1 | 50 | 150 | 0 | 0 | 0 | 0 | 0 |
| 2 | | 300 | 0 | 10 | 10 | 10 | 0 |
| 3 | | 500 | 0 | 20 | 20 | 20 | 0 |
| 4 | | 800 | 0 | 30 | 30 | 30 | 0 |
| 5 | | 1200 | 0 | 40 | 40 | 40 | 0 |

| No. | WAFER NUMBER | CORRECTION COEFFICIENT (%) | | | | |
|---|---|---|---|---|---|---|
| | | U | CU | C | CL | L |
| 1 | 25 | 0 | 0 | 0 | 0 | 0 |
| 2 | 50 | 0 | 0 | 50 | 50 | 0 |
| 3 | 75 | 0 | 50 | 75 | 75 | 0 |
| 4 | 100 | 0 | 100 | 100 | 100 | 0 |

SUBSTRATE PROCESSING APPARATUS, SEMICONDUCTOR DEVICE MANUFACTURING METHOD AND TEMPERATURE CONTROLLING METHOD

CROSS-REFERENCE TO RELATED PATENT APPLICATION

This U.S. non-provisional patent application claims priority under 35 U.S.C. §119 of Japanese Patent Application No. 2008-292284, filed on Nov. 14, 2008, in the Japanese Patent Office, the entire contents of which are hereby incorporated by reference.

BACKGROUND OF THE INVENTION

1. Field of the Invention

The present invention relates to a substrate processing apparatus, a semiconductor device manufacturing method, and a temperature controlling method.

2. Description of the Prior Art

In a conventional substrate processing apparatus or semiconductor device manufacturing apparatus, it is necessary to keep the inside temperature of a furnace at a proper level or make the inside temperature of the furnace follow a predetermined temperature variation, and for this end, a control device controls a heater according to a predetermined target temperature variation pattern (for example, refer to Patent Document 1).

[Patent Document 1] WO 2006/070552

In the conventional art, since it is necessary to keep the inside temperature of the furnace at a proper level or make the inside temperature of the furnace follow a predetermined temperature variation, the control device performs temperature controlling operations based on preset calculation parameters. However, it is difficult to cope with variations of factor temperature characteristics, for example, due to accumulation of films on the inner wall of a reaction vessel, and thus temperature stabilization is delayed.

SUMMARY OF THE INVENTION

Objects of the present invention are to provide a substrate processing apparatus, a semiconductor device manufacturing method, and a temperature controlling method, that are designed for coping with variations of temperature characteristics of the inside of a furnace, reducing heat treatment time, and improving the rate of operation of equipment.

According to an aspect of the present invention, there is provided a substrate processing apparatus comprising: a reaction vessel configured to accommodate at least a product wafer and a filler wafer; a heating unit configured to heat an inside of the reaction vessel; a temperature detector configured to detect a temperature at an inside of the heating unit; and a control device configured to perform a calculation by using a deviation between a set temperature and the temperature detected by the temperature detector and at least one calculation parameter so as to control the heating unit by using a result of the calculation, wherein the control device comprises a calculation parameter setting unit configured to determine the calculation parameter, wherein the calculation parameter setting unit comprises: a first calculation parameter setting unit configured to determine a first calculation parameter correction value based on an accumulated film thickness on the reaction vessel; a second calculation parameter setting unit configured to determine a second calculation parameter correction value based on an accumulated film thickness on the filler wafer; a third calculation parameter setting unit configured to determines a third calculation parameter correction value based on the number of the filler wafers; and a calculation parameter computing unit configured to compute the calculation parameter by using at least the first calculation parameter correction value, the second calculation parameter correction value, and the third calculation parameter correction value.

According to another aspect of the present invention, there is provided a semiconductor device manufacturing method comprising: computing a calculation parameter at a calculation parameter computing unit at least by using a first calculation parameter correction value which is determined by a first calculation parameter setting unit based on an accumulated film thickness on a reaction vessel, a second calculation parameter correction value which is determined by a second calculation parameter setting unit based on an accumulated film thickness on a filler wafer, and a third calculation parameter correction value which is determined by a third calculation parameter setting unit based on the number of filler wafers; and accommodating a product wafer and the filler wafer in the reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

According to another aspect of the present invention, there is provided a temperature controlling method comprising: computing a calculation parameter at a calculation parameter computing unit at least by using a first calculation parameter correction value which is determined based on an accumulated film thickness on a reaction vessel, a second calculation parameter correction value which is determined based on an accumulated film thickness on a filler wafer, and a third calculation parameter correction value which is determined based on the number of filler wafers; and controlling a heating unit by using a result of a calculation performed by using at least the computed calculation parameter and a deviation between a set temperature and a temperature detected at an inside of the heating unit by a temperature detector.

DETAILED DESCRIPTION OF THE PREFERRED EMBODIMENTS

Embodiments of the present invention will be described hereinafter with reference to the attached drawings.

First Embodiment

Figure 1:
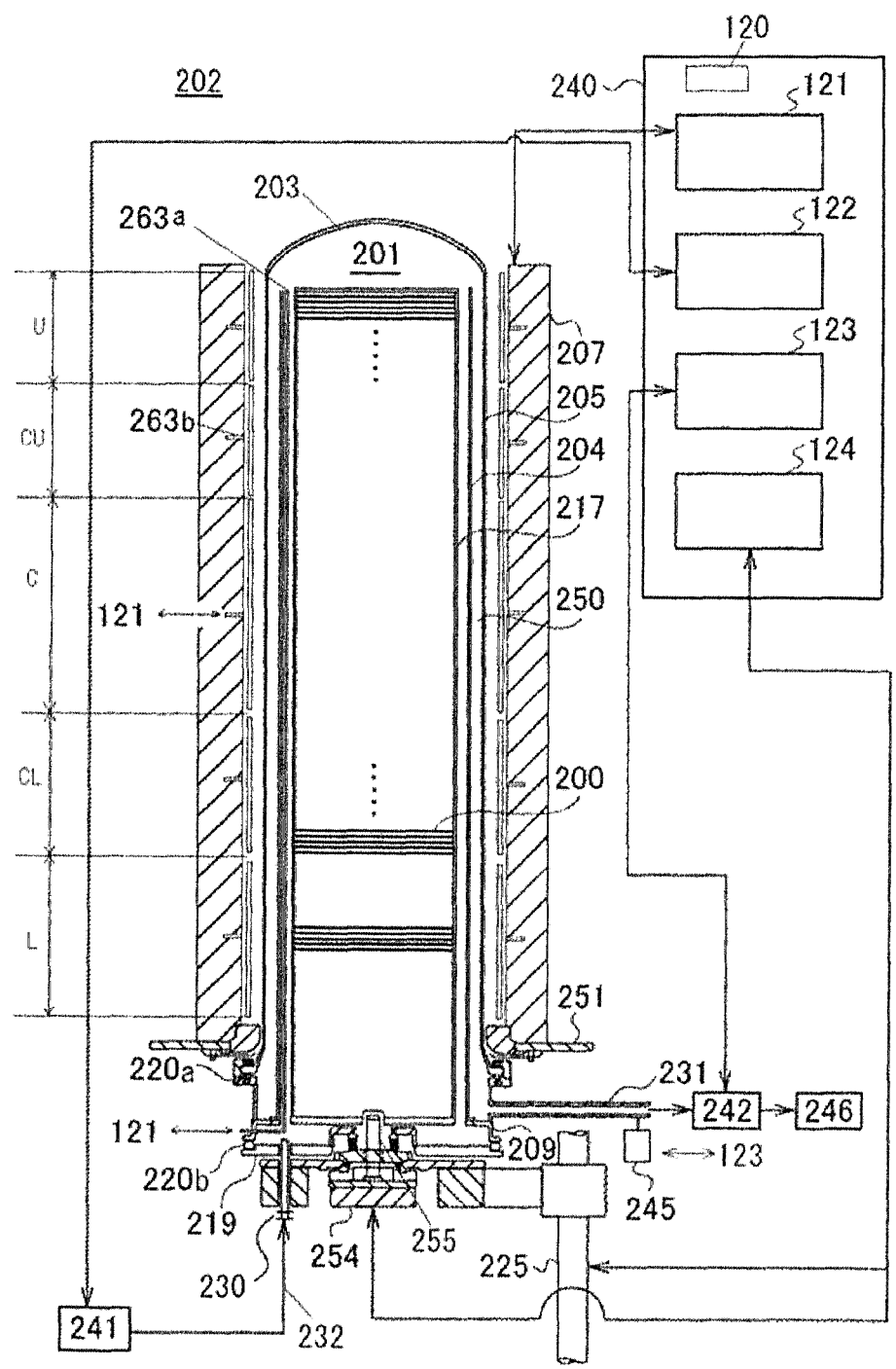
FIG. 1 is a detailed view illustrating the peripheral structure of a reaction tube of a heat treatment apparatus according to a first embodiment of the present invention.

FIG. 1 is a detailed vertical sectional view illustrating the peripheral structure of a process furnace of a heat treatment apparatus according to a first embodiment of the present invention.

As shown in FIG. 1, a process furnace 202 includes a heater 207 as a heating mechanism. The heater 207 has a cylindrical shape and is vertically installed in a manner such that the heater 207 is supported on a heater base 251 functioning as a holding plate.

At the inside of the heater 207, a process tube 203 is installed coaxially with the heater 207. The process tube 203 includes an inner tube 204 as an inner reaction tube and an outer tube 205 installed outside the inner tube 204 as an outer reaction tube. The inner tube 204 is made of a heat-resistant material such as quartz ($SiO_2$) or silicon carbide (SiC). The inner tube 204 has a cylindrical shape with opened top and bottom sides. At the hollow part of the inner tube 204, a process chamber 201 is formed. The process chamber 201 is configured to accommodate substrates such as wafers 200 by using a boat 217 (described later) in a state where the wafers 200 are horizontally positioned and vertically arranged in multiple stages. The outer tube 205 is made of a heat-resistant material such as quartz ($SiO_2$) or silicon carbide (SiC). The inner diameter of the outer tube 205 is greater than the outer diameter of the inner tube 204, and the outer tube 205 has a cylindrical shape with a closed top side and an opened bottom side. The outer tube 205 is installed coaxially with the inner tube 204.

At the lower side of the outer tube 205, a manifold 209 is installed coaxially with the outer tube 205. The manifold 209 is made of a material such as stainless steel and has a cylindrical shape with opened top and bottom sides. The manifold 209 is engaged with the inner tube 204 and the outer tube 205 and is installed to support the inner tube 204 and the outer tube 205. Between the manifold 209 and the outer tube 205, an O-ring 220a is installed as a seal member. Since the manifold 209 is supported on the heater base 251, the process tube 203 can be vertically fixed. The process tube 203 and the manifold 209 constitute a reaction vessel.

A nozzle 230 functioning as a gas introducing part is connected to a seal cap 219 (described later) in a manner such that the nozzle 230 communicates with the process chamber 201, and a gas supply pipe 232 is connected to the nozzle 230. A process gas supply source (not shown) or an inert gas supply source (not shown) is connected to the upstream side of the gas supply pipe 232 opposite to the nozzle 230 with a gas flowrate controller such as mass flow controller (MFC) 241 being disposed therebetween. A gas flowrate control unit 122 is electrically connected to the MFC 241 to control gas supply in a manner such that a desired amount of gas can be supplied at a desired time.

At the manifold 209, an exhaust pipe 231 is installed so as to exhaust the inside of the process chamber 201. The exhaust pipe 231 is located at a lower end of a cylindrical space 250 formed between the inner tube 204 and the outer tube 205, and the exhaust pipe 231 communicates with the cylindrical space 250. A vacuum exhaust device 246 such as a vacuum pump is connected to the downstream side of the exhaust pipe 231 opposite to the manifold 209 with a pressure sensor 245 (pressure detector) and a pressure regulating device 242 being disposed therebetween, so that the inside of the process chamber 201 can be evacuated to a predetermined pressure (vacuum degree). A pressure control unit 123 is electrically connected to the pressure regulating device 242 and the pressure sensor 245, and the pressure control unit 123 is configured to control the pressure regulating device 242 based on pressure information detected by the pressure sensor 245 so that the inside pressure of the process chamber 201 can be adjusted to a desired value at a desired time.

At the lower side of the manifold 209, the seal cap 219 is installed as a furnace port cover capable of air-tightly closing the opened bottom side of the manifold 209. The seal cap 219 is brought into contact with the bottom side of the manifold 209 in a vertical direction from the underside of the manifold 209. The seal cap 219 is made of a metal such as stainless steel and has a disk shape. On the surface of the seal cap 219, an O-ring 220b is installed as a seal member that makes contact with the bottom side of the manifold 209. At a side of the seal cap 219 opposite to the process chamber 201, a rotary mechanism 254 is installed to rotate the boat 217. A rotation shaft 255 of the rotary mechanism 254 is connected to the boat 217 (described later) through the seal cap 219 and is configured to rotate wafers 200 by rotating the boat 217. The seal cap 219 is configured to be vertically moved by a boat elevator 225, which is vertically installed outside the process tube 203 as a lifting mechanism, so that the boat 217 can be loaded into and unloaded from the process chamber 201. A driving control unit 124 is electrically connected to the rotary mechanism 254 and the boat elevator 225, so that desired operations of the rotary mechanism 254 and the boat elevator 225 can be carried out at a desired time.

The boat 217 being a substrate holding unit is made of a heat-resistant material such as quartz ($SiO_2$) or silicon carbide (SiC) and is configured to hold a plurality of wafers 200 in a state where the wafers 200 are horizontally positioned and arranged in multiple stages with the centers of the wafers 200 being aligned with each other. At the lower part of the boat 217, a plurality of insulating plates 216, which are insulating members made of a heat-resistant material such as quartz ($SiO_2$) or silicon carbide (SiC) and having a disk shape, are horizontally positioned and arranged in multiple stages, so as to prevent heat transfer from the heater 207 to the manifold 209.

At the heater 207, a plurality of independent zones are formed, and the independent zones are configured to be controlled independently of each other, so as to control the inside temperature of the process chamber 201 more precisely. For example, the heater 207 is divided into an upper zone (U-zone), a center zone (C-zone), an intermediate zone (CU-zone) between the center zone (C-zone) and the upper zone (U-zone), a lower zone (L-zone), and an intermediate zone (CL-zone) between the center zone (C-zone) and the lower zone (L-zone).

At the inside of the process tube 203, an inner temperature sensor 263a is installed as a temperature detector configured to measure the inside temperature of the process tube 203. The inner temperature sensor 263a includes detection points located at positions corresponding to the plurality of zones of the heater 207. That is, a plurality of detection points are installed at the inner temperature sensor 263a.

At the heater 207, outer temperature sensors 263b are installed as temperature detectors configured to measure the temperature of a heating element installed at the heater 207. The outer temperature sensors 263b are installed at positions corresponding to the plurality of zones of the heater 207. That is, a plurality of outer temperature sensors 263b are installed.

A temperature control unit 121 is electrically connected to the inner temperature sensor 263a, the outer temperature sensors 263b, and the (control) zones of the heater 207, and so as to keep the inside temperature of the process tube 203 at a preset level, temperatures are measured by using the inner temperature sensor 263a and the outer temperature sensors 263b, and the output of the heater 207 is controlled by using the temperature control unit 121.

That is, based on differences between temperature values set for the (heating) zones of the heater 207 and temperature values measured by using the inner temperature sensor 263a and the outer temperature sensors 263b, the temperature control unit 121 outputs power control signals for the respective heating zones of the heater 207 so that desired temperature distribution can be obtained at the inside of the process chamber 201 at a desired time.

It is illustrated that the inner temperature sensor 263a is installed at the inside of the inner tube 204. However, the insulating part 263 can be installed at any other position inside the process tube 203, for example, at a position in the cylindrical space 250. For example, it is preferable that the inner temperature sensor 263a be installed at a position closer to wafers 200 than the outer temperature sensors 263b. In addition, although it is illustrated that the outer temperature sensors 263b are installed at the heater 207, the outer temperature sensors 263b can be installed at other positions closer to the heating element of the heater 207 than the inner temperature sensor 263a.

The gas flowrate control unit 122, the pressure control unit 123, the driving control unit 124, and the temperature control unit 121 constitute a manipulation unit and an input/output unit, and are electrically connected to a main control unit 120 used to control the overall operation of a substrate processing apparatus. The gas flowrate control unit 122, the pressure control unit 123, the driving control unit 124, the temperature control unit 121, and the main control unit 120 are configured as a controller 240.

Next, as one of semiconductor device manufacturing processes performed by using the above-described process furnace 202, a method of forming a thin film on a wafer 200 by a chemical vapor deposition (CVD) method will be described. In the following description, each part of the substrate processing apparatus is controlled by the controller 240.

When a plurality of wafers 200 are charged into the boat 217, the bottom side of the manifold 209 is opened by releasing a furnace port gate valve (cover body) (not shown). As shown in FIG. 1, the boat 217 in which the plurality of wafers 200 are held is lifted by the boat elevator 225 and is loaded into the process chamber 201 (boat loading). In this state, the bottom side of the manifold 209 is sealed by the seal cap 219 with the O-ring 220b being disposed therebetween.

The inside of the process chamber 201 is evacuated by the vacuum exhaust device 246 to a desired pressure (vacuum degree). At this time, the inside pressure of the process chamber 201 is measured by the pressure sensor 245, and the pressure regulating device 242 is feedback-controlled based on the measured pressure. In addition, the inside of the process chamber 201 is heated by the heater 207 to a desired temperature. At this time, to obtain desired temperature distribution at the inside of the process chamber 201, power to the heater 207 is feedback-controlled based on temperature information detected by the temperature sensors 263. Subsequently, the boat 217 is rotated by the rotary mechanism 254 so that the wafers 200 can be rotated.

Subsequently, gas supplied from the process gas supply source and of which the flowrate is controlled by the MFC 241 is carried through the gas supply pipe 232 and introduced into the process chamber 201 through the nozzle 230. The introduced gas flows upward inside the process chamber 201 and discharged to the cylindrical space 250 through the opened top side of the inner tube 204, and then the gas is exhausted through the exhaust pipe 231. When the gas flows through the process chamber 201, the gas makes contact with the surfaces of the wafers 200, and at this time, thin films are deposited on the surfaces of the wafers 200 in a non-plasma state by thermal CVD reaction.

After a predetermined process time, inert gas is supplied from the inert gas supply source, and while the inside atmosphere of the process chamber 201 is replaced with the inert gas, the inside pressure of the process chamber 201 returns to atmospheric pressure.

Thereafter, the seal cap 219 is moved downward by the boat elevator 225, and at the same time with the bottom side of the manifold 209 being opened, the processed wafers 200 are unloaded from the process tube 203 through the bottom side of the manifold 209 in a state where the wafers 200 are held in the boat 217 (boat unloading). Thereafter, the processed wafers 200 are discharged from the boat 217 (wafer discharging).

Meanwhile, for example, wafers may be processed in the process furnace 202 of the current embodiment under the following conditions. For example, if phosphorous silicon films are formed, process temperature is kept in the range from 500° C. to 650° C., process pressure is kept in the range from 13.3 Pa to 1330 Pa, and gas containing phosphor atoms and gas containing silicon atoms are supplied to the process chamber 201. Each process condition may be kept at a constant value within the above mentioned range when wafers are processed.

Figure 2:
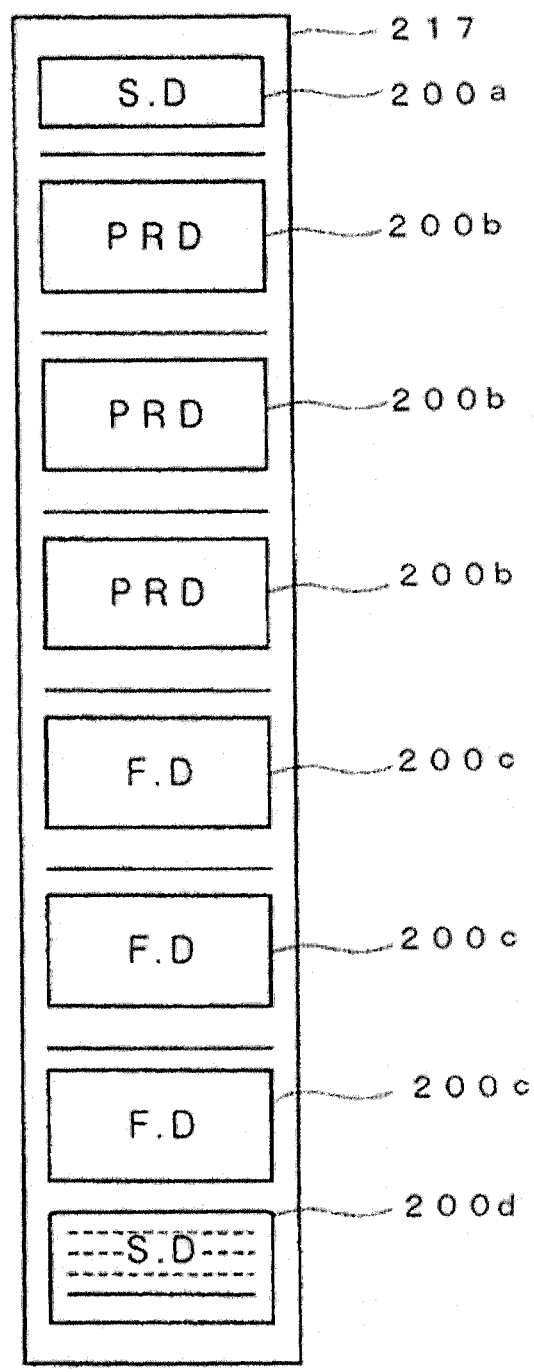
FIG. 2 is a view illustrating wafers placed in a boat when the wafers are processed in a process chamber of the heat treatment apparatus according to the first embodiment.

FIG. 2 illustrates wafers 200 placed in the boat 217 when the wafers 200 are processed in the process chamber 201. Referring to FIG. 2, from the upper side to the lower side of the boat 217, upper side dummy wafers (S.D) 200a, product wafers (PRDs) 200b, filler dummy wafers (F.D) 200c (hereinafter, also referred to simply as filler wafers 200c), and lower side dummy wafers (S.D) 200d are placed. Among the upper side dummy wafers (S.D) 200a, the product wafers (PRDs) 200b, the filler dummy wafers (F.D) 200c, and the lower side dummy wafers (S.D) 200d, monitor wafers are placed.

If the number of product wafers 200b to be processed is smaller than the number of wafers that can be placed in a product-wafer process region of the boat 217, the filler dummy wafers 200c are placed at positions of the product-wafer process region of the boat 217 where the product wafers 200b are not placed. Therefore, the product wafers 200b can be processed under approximately the same heat treatment conditions as in the case where the product-wafer process region of the boat 217 is fully filled with wafers, and thus, the product wafers 200b can have improved characteristics such as in-surface film thickness uniformity, inter-wafer film thickness uniformity, and inter-batch film thickness uniformity.

Figure 3:
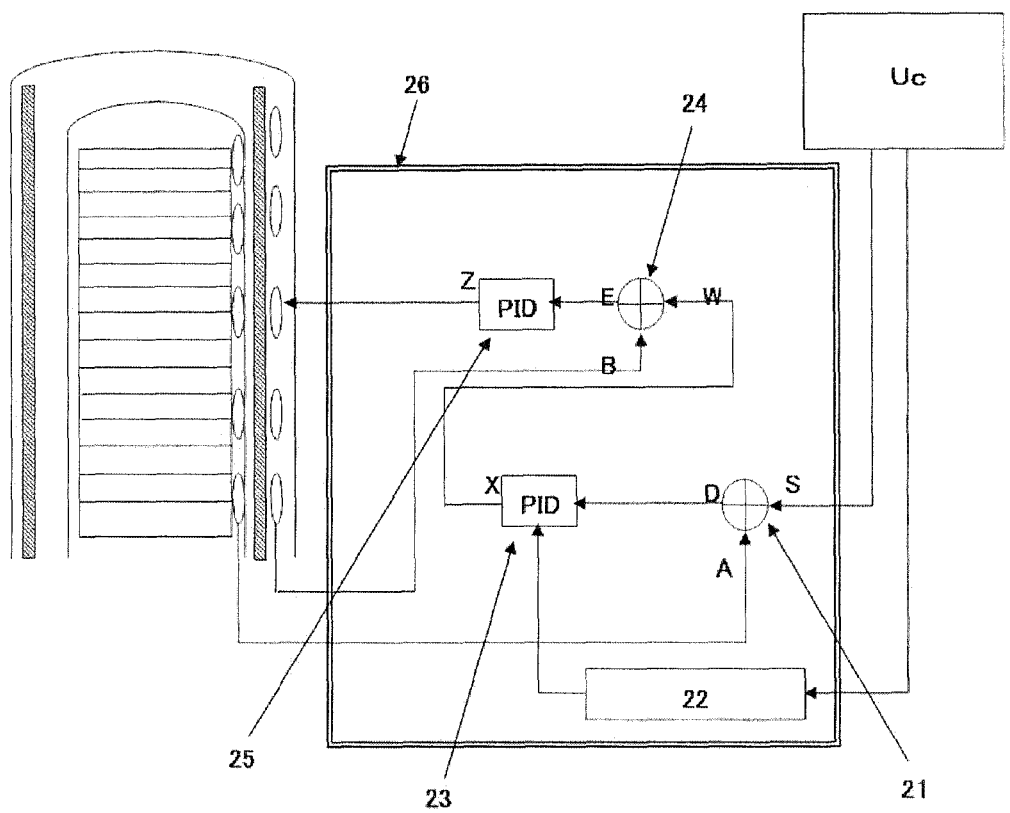
FIG. 3 is a functional block diagram illustrating a control device of a temperature control unit of the heat treatment apparatus illustrated in FIG. 1.

FIG. 3 is a functional block diagram illustrating a control device 26 of the temperature control unit 121 of the heat treatment apparatus illustrated in FIG. 1. For each of the heating zones of the heater 207, the temperature control unit 121 controls the heater 207, the inner temperature sensor 263a, and the outer temperature sensors 263b, respectively. However, in the following description, unless mentioned otherwise, an explanation will be given on one of the heating zones.

As shown in FIG. 3, the control device 26 includes subtracters 21 and 24, proportional-integral-derivative (PID) calculators 23 and 25, and a calculation parameter setting unit 22.

The subtracter 21 calculates a deviation (D) by subtracting between a set value (S) set at an upper controller Uc and a control value (A) so as to output the calculated deviation (D) to the PID calculator 23.

The subtracter 24 calculates a deviation (E) by subtracting between a value (W) output from the PID calculator 23 and a control value (B) so as to output the calculated deviation (E) to the PID calculator 25.

Figure 4:
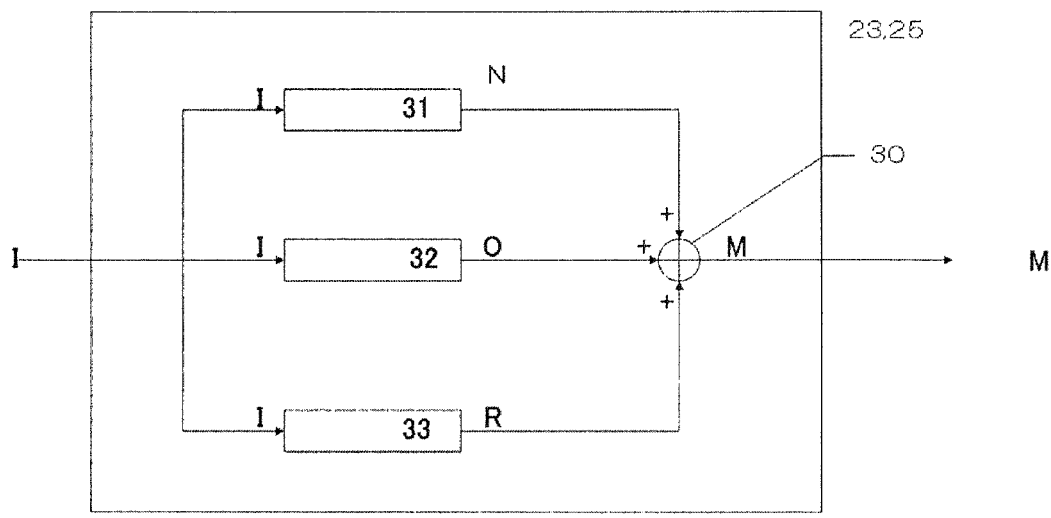
FIG. 4 is a functional block diagram illustrating a proportional-integral-derivative (PID) calculator.

Next, the PID calculators 23 and 25 will now be explained with reference to FIG. 4. As shown in FIG. 4, each of the PID calculators 23 and 25 includes an adder 30, an integral calculation unit 31, a proportional calculation unit 32, and a derivative calculation unit 33.

The integral calculation unit 31 receives a deviation (I) and outputs an integral value (N) by integrating the deviation (I) with respect to time (I calculation) and multiplying the integrated deviation (I) by a preset parameter Ki. If the deviation (I) at a certain time (t) is denoted by I(t) and the integral value (N) at the time (t) is denoted by N(t), the integral value (N) can be expressed by Equation (1) below.

[Equation 1]

$$N(t) = Ki \cdot \int_0^t I(u)du \tag{1}$$

The proportional calculation unit 32 receives the deviation (I) and outputs a proportional value (O) by multiplying the deviation (I) by a preset parameter Kp. If the deviation (I) at a certain time (t) is denoted by I(t) and the proportional value (O) at the time (t) is denoted by O(t), the proportional value (O) can be expressed by Equation (2) below.

[Equation 2]

$$O(t) = Kp \cdot I(t) \tag{2}$$

The derivative calculation unit 33 receives the deviation (I) and outputs a derivative value (R) by differentiating the deviation (I) with respect to time (D calculation) and multiplying the differentiated deviation (I) by a preset parameter Kd. If the deviation (I) at a certain time (t) is denoted by I(t) and the derivative value (R) at the time (t) is denoted by R(t), derivative value (R) can be expressed by Equation (3) below.

[Equation 3]

$$R(t) = Kd \cdot dI(t)/dt \tag{3}$$

The adder 30 receives the integral value (N), the proportional value (O), and the derivative value (R), and outputs a manipulation value (M) by calculating the sum of the values (N), (O), and (R).

If the deviation (I) at a certain time (t) is denoted by I(t) and the manipulation value (M) at the time (t) is denoted by M(t), the manipulation value (M) can be expressed as Equation (4) below by combining Equations (1), (2), and (3).

[Equation 4]

$$M(t) = Kp \cdot I(t) + Ki \cdot \int_0^t I(u)du + Kd \cdot dI(t)/dt \tag{4}$$

Next, with reference to FIG. 5, an explanation will now be given on the calculation parameter setting unit 22, which is connected to the upper controller Uc and instructs the PID calculator 23 of a calculation parameter (H).

Figure 5:
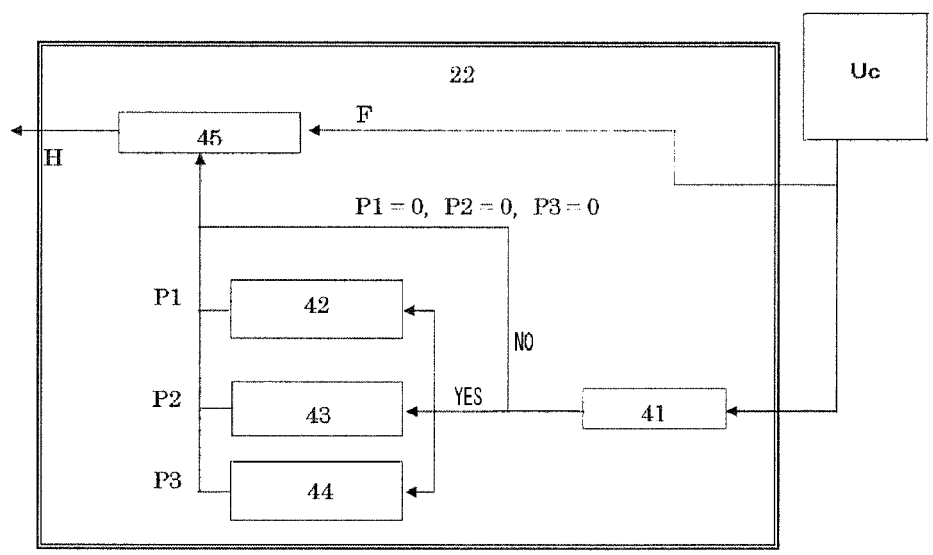
FIG. 5 is a functional block diagram illustrating a calculation parameter setting unit.

As shown in FIG. 5, the calculation parameter setting unit 22 includes a step identification (ID) determination unit 41, a reaction tube accumulated film thickness calculation parameter setting unit 42, a filler wafer accumulated film thickness calculation parameter setting unit 43, a filler wafer number calculation parameter setting unit 44, and a calculation parameter computing unit 45. The calculation parameter setting unit 22 determines a calculation parameter (H) that is used by the PID calculator 23 for PID calculation.

First, the reaction tube accumulated film thickness calculation parameter setting unit 42 will now be explained. When a predetermined film forming process such as a doped-poly film forming process or a $Si_3N_4$ film forming process is consecutively repeated a plurality of times in a batch manner, a film is accumulated on the inner wall of the reaction vessel, particularly, on the inner wall of the process tube 203. Due to this, the heat absorptance, reflectance, and transmittance of the process tube 203 are varied, and thus, although the heater 207 is manipulated in the same way, the temperature increase rate of the inside of the reaction vessel is varied. Due to such variations as the heat absorptance variation, particularly, product wafers 200b or the temperature detecting operation of the inner temperature sensor 263a is often thermally affected. To solve this problem, the reaction tube accumulated film thickness calculation parameter setting unit 42 is used to manage the thickness of a film accumulated on the process tube 203 having a dominant effect.

At the reaction tube accumulated film thickness calculation parameter setting unit 42, a reaction tube accumulated film thickness range of substances attached to the process tube 203, and a reaction tube calculation parameter correction value corresponding to the reaction tube accumulated film thickness range are set and stored.

If a reaction tube accumulated film thickness received from the upper controller Uc, such as an actually accumulated film thickness of substances attached to the process tube 203, is within the reaction tube accumulated film thickness range stored in the reaction tube accumulated film thickness calculation parameter setting unit 42, the reaction tube accumulated film thickness calculation parameter setting unit 42 selects the reaction tube calculation parameter correction value corresponding to the reaction tube accumulated film thickness range and delivers it to the calculation parameter computing unit 45 so as to correct a calculation parameter.

The reaction tube accumulated film thickness range of substances attached to the reaction tube is matched with the corresponding calculation parameter correction value, and this matching can be set and modified by an operator's input.

Preferably, the matching may be set and modified based on data such as previously acquired data, experimental data, and statistical data.

Preferably, a plurality of reaction tube accumulated film thickness ranges may be set, and calculation parameter correction values may be set in relation with the respective reaction tube accumulated film thickness ranges. In this case, more precise controlling is possible.

Preferably, a plurality of reaction tube accumulated film thickness ranges may be set, and calculation parameter correction values may be set in relation with the respective reaction tube accumulated film thickness ranges for each of the control zones of the heater 207. In this case, more precise controlling is possible.

Next, the filler wafer accumulated film thickness calculation parameter setting unit 43 will now be explained.

If a predetermined film forming process such as a doped-poly film forming process or a $Si_3N_4$ film forming process is consecutively repeated a plurality of times in a batch manner, films are accumulated on the filler wafers 200c as well as the reaction vessel, and thus, heat absorptance varies so that thermal influence is exerted particular on product wafers 200b or the temperature detecting operation of the inner temperature sensor 263a.

To solve this problem, each time a film forming process is performed, the filler wafer accumulated film thickness calculation parameter setting unit 43 manages the accumulated film thickness on the filler wafers 200c.

At the filler wafer accumulated film thickness calculation parameter setting unit 43, a filler wafer accumulated film thickness range of substances attached to the filler wafers 200c, and a filler wafer calculation parameter correction value corresponding to the filler wafer accumulated film thickness range are set and stored.

If a filler wafer accumulated film thickness received from the upper controller Uc, such as an actually accumulated film thickness of substances attached to the filler wafer 200c, is within the filler wafer accumulated film thickness range stored at the filler wafer accumulated film thickness calculation parameter setting unit 43, the filler wafer accumulated film thickness calculation parameter setting unit 43 selects the filler wafer calculation parameter correction value corresponding to the filler wafer accumulated film thickness range and delivers it to the calculation parameter computing unit 45 so as to correct the calculation parameter.

The filler wafer accumulated film thickness range of substances attached to the filler wafers 200c is matched with the corresponding filler wafer calculation parameter correction value, and this matching can be set and modified by an operator's input.

Preferably, the matching may be set and modified based on data such as previously acquired data, experimental data, and statistical data.

In addition, when a film forming process is performed using a plurality of filler wafers 200c, the use number of the filler wafers 200c and film forming process conditions may be different for each of the filler wafers 200c, and in this case, the thicknesses of films deposited on the filler wafers 200c may be different. Preferably, the maximum of accumulated film thicknesses of all filler wafers 200c placed in the boat 217 for the next film forming process may be selected. If it is difficult to find the maximum accumulated film thickness, it is preferable that the upper controller Uc or the main control unit 120 be used to manage usage histories such as the use number of the filler wafers 200c or film forming process conditions, or accumulated film thicknesses for each of the filler wafers 200c, so as to select the maximum of the managed accumulated film thicknesses. Since temperature is largely increased to result in large accumulated film thicknesses on the filler wafers 200c, the maximum of accumulated film thicknesses is selected instead of selecting the average of the accumulated film thicknesses, such that overshoot from a set temperature of the process chamber 201 can be reduced and temperature control characteristics can be improved. Meanwhile, if overshoot from the set temperature of the process chamber 201 is not problem, the average of accumulated film thicknesses of filler wafers 200c placed in the boat 217 for a film forming process may be selected.

In addition, preferably, a plurality of filler wafer accumulated film thickness ranges may be set, and filler wafer parameter correction values may be set in relation with the respective filler wafer accumulated film thickness ranges. In this case, more precise controlling is possible.

More preferably, a plurality of filler wafer accumulated film thickness ranges may be set, and filler wafer parameter correction values may be set in relation with the respective filler wafer accumulated film thickness ranges for each of the control zones of the heater 207. In this case, more precise controlling is possible.

Next, the filler wafer number calculation parameter setting unit 44 (filler wafer number calculation coefficient setting unit 44) will be explained.

As explained above, the accumulated film thicknesses of the filler wafers 200c have thermal influence on product wafers 200b and the temperature detecting operation of the inner temperature sensor 263a, and this influence may be varied according to the number of the filler wafers 200c. For example, although a calculation parameter correction value (Y) is determined as described above, thermal influence on the product wafers 200b and the temperature detecting operation of the inner temperature sensor 263a is very different in the case where the number of the filler wafers 200c is one as compared with the case where the number of the filler wafers 200c is fifty.

Therefore, at the filler wafer number calculation coefficient setting unit 44, the number of all filler wafers 200c placed in the boat 217 for the next substrate processing process, and a filler wafer calculation coefficient corresponding to the number of the filler wafers 200c are set and stored.

If the number of filler wafers 200c received from the upper controller Uc such as the number of all filler wafers 200c placed in the boat 217 for the next substrate processing process is within a filler wafer number range stored the filler wafer number calculation coefficient setting unit 44, the filler wafer number calculation coefficient setting unit 44 selects a filler wafer calculation coefficient corresponding to the filler wafer number range and transmits the selected filler wafer calculation coefficient to the calculation parameter computing unit 45 so as to correct a filler wafer calculation parameter.

Preferably, settings and modifications of the settings may be done based on data such as previously acquired data, experimental data, and statistical data.

Preferably, a plurality of filler wafer number ranges may be set, and calculation coefficients may be set in relation with the respective filler wafer number ranges. In this case, more precise controlling is possible.

Preferably, a plurality of filler wafer number ranges may be set, and calculation coefficients may be set in relation with the respective filler wafer number ranges for each of the control zones of the heater 207. In this case, more precise controlling is possible.

Next, the calculation parameter computing unit 45 will be explained.

The calculation parameter computing unit 45 calculates a calculation parameter correction value (P) from a reaction tube calculation parameter correction value P1, a filler wafer calculation parameter correction value P2, and a filler wafer number calculation coefficient 93 that are received from the reaction tube accumulated film thickness calculation parameter setting unit 42, the filler wafer accumulated film thickness calculation parameter setting unit 43, and the filler wafer number calculation coefficient setting unit 44, respectively; and the calculation parameter computing unit 45 determines a calculation parameter (H) for PID calculation by reflecting a calculation parameter (F) received from the upper controller Uc. For example, the calculation parameter (H) is called as "proportional band" in relation with the above-mentioned Kp (proportional gain), and the Kp is calculated by dividing 100 by the calculation parameter (H) as expressed by Equation (5) below.

$$Kp=100/H \quad (5)$$

As expressed by Equation (6) below, the calculation parameter correction value (P) is calculated by adding the reaction tube calculation parameter correction value P1 to the product of the filler wafer calculation parameter correction value P2 and the calculation coefficient P3.

The calculation parameter (H) used for PID calculation is calculated as expressed by Equation (7). In Equation (7), (F) denotes a P constant input from the upper controller Uc, and the calculation parameter (H) is calculated as the sum of the calculation parameter correction value (P) calculated by Equation (6) and the P constant (F).

$$P=P1+P2 \cdot P3 \quad (6)$$

$$H=F+P \quad (7)$$

Next, the step ID determination unit 41 will be described.

A process recipe is constituted by a plurality of steps. In each of the plurality of steps, settings such as a temperature setting and a pressure setting are done, and a film forming process is carried out by performing the plurality of steps sequentially. For the respective steps, step IDs are previously registered in the main control unit 120. In addition, IDs of the steps in which the reaction tube accumulated film thickness calculation parameter setting unit 42, the filler wafer accumulated film thickness calculation parameter setting unit 43, and the filler wafer number calculation coefficient setting unit 44 are used, are previously set in the main control unit 120 or the control device 26.

The step ID determination unit 41 determines whether a step having a preset step ID is performed or not.

If the step ID determination unit 41 determines that a step having a preset step ID is performed, the reaction tube accumulated film thickness calculation parameter setting unit 42, the filler wafer accumulated film thickness calculation parameter setting unit 43, and the filler wafer number calculation coefficient setting unit 44 are used. Meanwhile, if the step ID determination unit 41 determines that a step having a preset step ID is not performed, the reaction tube accumulated film thickness calculation parameter setting unit 42, the filler wafer accumulated film thickness calculation parameter setting unit 43, and the filler wafer number calculation coefficient setting unit 44 are not used. That is, owing to the step ID determination unit 41, in each step, it can be set whether the reaction tube accumulated film thickness calculation parameter setting unit 42, the filler wafer accumulated film thickness calculation parameter setting unit 43, and the filler wafer number calculation coefficient setting unit 44 are used or not.

Only when a step having a certain step ID is performed, the reaction tube accumulated film thickness calculation parameter setting unit 42, the filler wafer accumulated film thickness calculation parameter setting unit 43, and the filler wafer number calculation coefficient setting unit 44 are turned on. For example, in a step that does not largely affect accumulation of films or during which wafers are not placed in the process chamber 201, processing repeatability can be ensured although the reaction tube accumulated film thickness calculation parameter setting unit 42, the filler wafer accumulated film thickness calculation parameter setting unit 43, and the filler wafer number calculation coefficient setting unit 44 are not used, so that the reaction tube accumulated film thickness calculation parameter setting unit 42, the filler wafer accumulated film thickness calculation parameter setting unit 43, and the filler wafer number calculation coefficient setting unit 44 can be turned off.

Owing to the step ID determination unit 41, the reaction tube accumulated film thickness calculation parameter setting unit 42, the filler wafer accumulated film thickness calculation parameter setting unit 43, and the filler wafer number calculation coefficient setting unit 44 can be turned on only for a process in which it seams that a film is accumulated, and in other processes, the reaction tube accumulated film thickness calculation parameter setting unit 42, the filler wafer accumulated film thickness calculation parameter setting unit 43, and the filler wafer number calculation coefficient setting unit 44 can be turned off, so that process repeatability can be ensured without having to use complicated calculations and regardless of influences by accumulated films. Therefore, different processes such as a heat treatment process and a film forming process can be multiply performed by using a single substrate processing apparatus.

That is, if the step ID of a current step acquired by the upper controller Uc is equal to a set step ID, the reaction tube accumulated film thickness calculation parameter setting unit 42, the filler wafer accumulated film thickness calculation parameter setting unit 43, and the filler wafer number calculation coefficient setting unit 44 are turned on, and the above-described calculation parameter computing process is performed.

If the step ID of the step is not equal to the set step ID, the reaction tube accumulated film thickness calculation parameter setting unit 42, the filler wafer accumulated film thickness calculation parameter setting unit 43, and the filler wafer number calculation coefficient setting unit 44 are not used, and a PID calculation is performed by using a calculation parameter (F) received from the upper controller Uc.

Next, with reference to the block diagrams of FIG. 3 and FIG. 5, operations of the control device 26 and the heater 207 will be mainly described.

A target value (S) is input to the subtracter 21 of the control device 26 from the upper controller Uc. In addition, a control value (A) obtained based on a value detected by the inner temperature sensor 263a is input to the subtracter 21. The subtracter 21 outputs a deviation (D) by subtracting the control value (A) from the target value (S).

In addition, a step ID and a base P constant (F) are input from the upper controller Uc to the calculation parameter setting unit 22 of the control device 26. The base P constant (F) is input to the calculation parameter computing unit 45 of the calculation parameter setting unit 22. The step ID is input to the step ID determination unit 41 of the calculation parameter setting unit 22.

The step ID determination unit 41 determines whether the input step ID is equal to a preset certain ID.

If the step ID determination unit 41 determines that the input step ID is equal to the preset certain ID, the reaction tube accumulated film thickness calculation parameter setting unit 42, filler wafer accumulated film thickness calculation parameter setting unit 43, and the filler wafer number calculation coefficient setting unit 44 determine a reaction tube calculation parameter correction value P1, a filler wafer calculation parameter correction value P2, and a filler wafer number calculation coefficient P3, respectively.

The determined reaction tube calculation parameter correction value P1, filler wafer calculation parameter correction value P2, and filler wafer number calculation coefficient P3 are input to the calculation parameter computing unit 45.

The calculation parameter computing unit 45 determines a calculation parameter (H) from the base P constant (F), the reaction tube calculation parameter correction value P1, the filler wafer calculation parameter correction value P2, and the filler wafer number calculation coefficient P3 by using Equations (6) and (7).

The calculation parameter (H) is converted to a proportional gain Kp1 according to Equation (5), and the proportional gain Kp of the PID calculator 23 is replaced with the proportional gain Kp1.

The PID calculator 23 performs a PID calculation on the deviation (D) output from the subtracter 21 by using a PID calculation formula with the replaced proportional gain Kp1 so as to determine a manipulation value (X). The manipulation value (X) is converted to a target value (W) and input to the subtracter 24. In addition, based on values detected by the outer temperature sensors 263b, a control value (B) is input to the subtracter 24. The subtracter 24 outputs a deviation (E) by subtracting the control value (B) from the target value (W). The PID calculator 25 performs a PID calculation on the deviation (E) output from the subtracter 24 so as to determine a manipulation value (Z). The manipulation value (Z) is output from the control device 26 and input to the heater 207. Then, control values (A) and (B) are output again from the heater 207 and input to the control device 26. In this way, the manipulation value (Z) output from the control device 26 is varied with time so that the deviation (D) between the target value (S) and the control value (A) can become zero.

Meanwhile, if it is determined that the input step ID is not equal to the preset certain ID, the reaction tube accumulated film thickness calculation parameter setting unit 42, filler wafer accumulated film thickness calculation parameter setting unit 43, and the filler wafer number calculation coefficient setting unit 44 are not used. A reaction tube calculation parameter correction value P1, a filler wafer calculation parameter correction value P2, and a filler wafer number calculation coefficient P3 are respectively set to zero (P1=0, P2=0, and P3=0) and are input to the calculation parameter computing unit 45 together with a base P constant (F). The calculation parameter computing unit 45 determines a calculation parameter (H) from the base P constant (F), the reaction tube calculation parameter correction value P1, the filler wafer calculation parameter correction value P2, and the filler wafer number calculation coefficient P3 by using Equations (6) and (7). That is, the base P constant (F) is used as the calculation parameter (H).

The calculation parameter (H) is converted to a proportional gain Kp1 according to Equation (5), and the proportional gain Kp of the PID calculator 23 is replaced with the proportional gain Kp1. Meanwhile, if the proportional gain Kp=Kp1, the control procedure may be performed without replacement of the proportional gain Kp.

The PID calculator 23 performs a PID calculation on the deviation (D) output from the subtracter 21 by using a PID calculation formula with the replaced proportional gain Kp1 so as to determine a manipulation value (X). The manipulation value (X) is converted to a target value (W) and input to the subtracter 24. In addition, based on values detected by the outer temperature sensors 263b, a control value (B) is input to the subtracter 24. The subtracter 24 outputs a deviation (E) by subtracting the control value (B) from the target value (W). The PID calculator 25 performs a PID calculation on the deviation (E) output from the subtracter 24 so as to determine a manipulation value (Z). The manipulation value (Z) is output from the control device 26 and input to the heater 207. Then, control values (A) and (B) are output again from the heater 207 and input to the control device 26. In this way, the manipulation value (Z) output from the control device 26 is varied with time so that the deviation (D) between the target value (S) and the control value (A) can become zero.

Experimental Example

Figure 6:
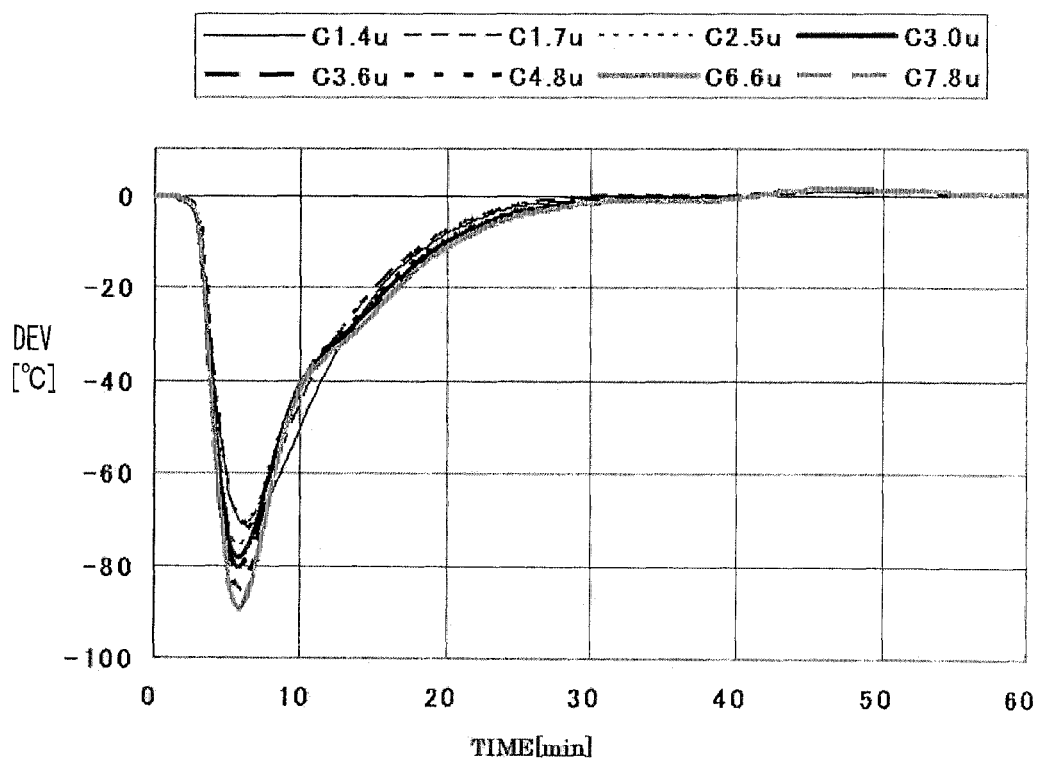
FIG. 6 is a graph illustrating temperature waveforms detected when the boat is loaded by an inner temperature sensor for different accumulated film thicknesses.

FIG. 6 is a graph showing temperature waveforms detected by using the inner temperature sensor disposed at the C-zone where product wafers were located when the boat in which substrates (wafers) were placed was carried into (hereinafter, referred to as "loaded into") the reaction tube, the temperature waveforms being detected for different accumulated film thicknesses of substances attached to the inner wall of the reaction tube in a condition where the reaction tube accumulated film thickness calculation parameter setting unit 42, the filler wafer accumulated film thickness calculation parameter setting unit 43, and the filler wafer number calculation coefficient setting unit 44 were not used. In addition, it was controlled with a proportional band P constant being fixed to 50%. In FIG. 6, the left vertical axis denotes temperature deviation values (° C.) from a set temperature, and the horizontal axis denotes time (min). The temperature waveforms were detected by using the inner temperature sensor 263a for the cases where the accumulated film thicknesses of substances attached to the C-zone of the inner wall of the reaction tube were 1.4 micrometers (C1.4µ), 1.7 micrometers (C1.7µ), 2.5 micrometers (C2.5µ), 3.0 micrometers (C3.0µ), 3.6 micrometers (C3.6µ), 4.8 micrometers (C4.80, 6.6 micrometers (C6.6µ), and 7.8 micrometers (C7.8µ). The temperature of the heater 207 was set to 530° C., and the temperature waveforms were detected from the start of a boat-up step (0 min) to the end of the boat-up step (60 min). For reference, 1 micrometer (µm) is 1000 nanometer (nm).

FIG. 6 will now be explained according to the boat-up step. The cover body (not shown) by which the bottom side of the process tube 203 was closed was moved to open the bottom side of the process tube 203. At that time, since heat was dissipated through the opened bottom side of the reaction tube, the temperature detected by the inner temperature sensor 263a was decreased, and the temperature was further decreased due to loading of the boat 217 in which wafers 200 were placed into the process tube 203 (0 min to 7 min). After the boat 217 was loaded into the process tube 203, the temperature detected by the inner temperature sensor 263a was increased (7 min to 20 min). Thereafter, the control device 26 was used to control the heater 207 so as to keep the temperature stably at the set temperature of 530° C. (20 min to 60 min).

Figure 7:
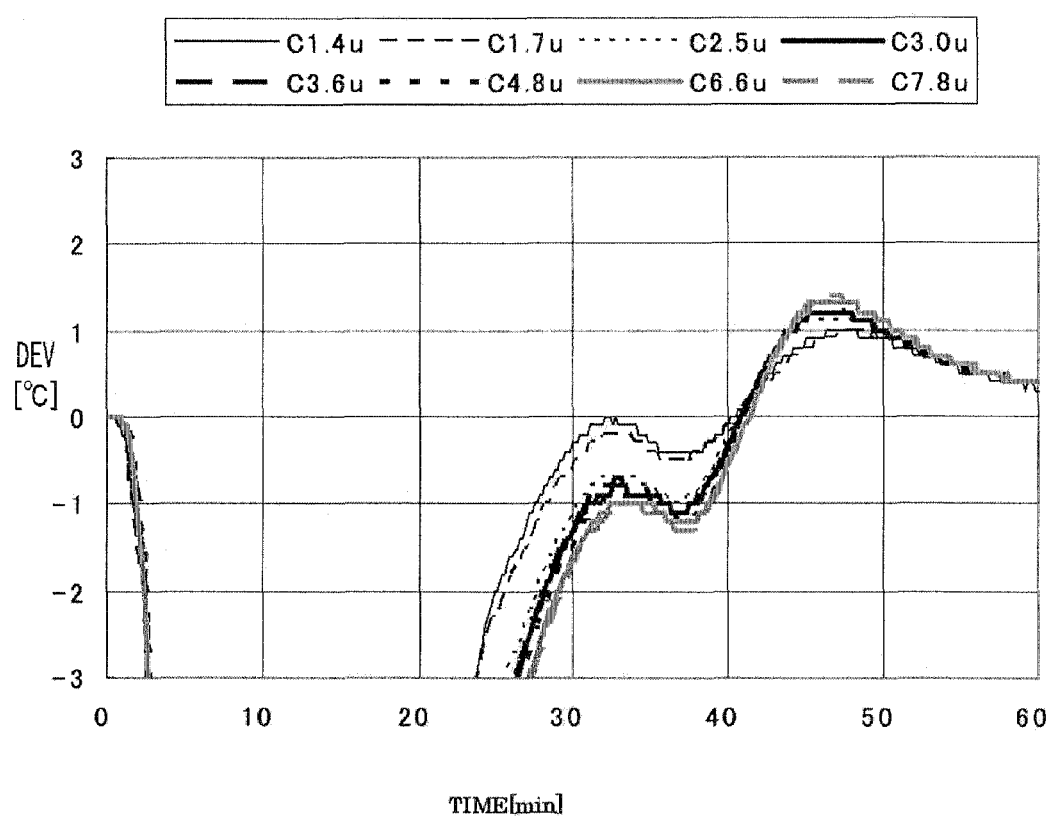
FIG. 7 is an enlarged view of the temperature waveforms of FIG. 6, showing a region close to 530° C.

FIG. 7 is an enlarged view of the temperature waveforms of FIG. 6, showing a region close to 530° C. As shown in FIG. 7, before 50 minutes from the start of the boat-up step, the temperature detected by the inner temperature sensor 263a is not stabilized within an error range of 1° C. from the set temperature, and as the accumulated film thickness of attached substances increases, the temperature detected by the inner temperature sensor 263a is decreased.

Figure 8:
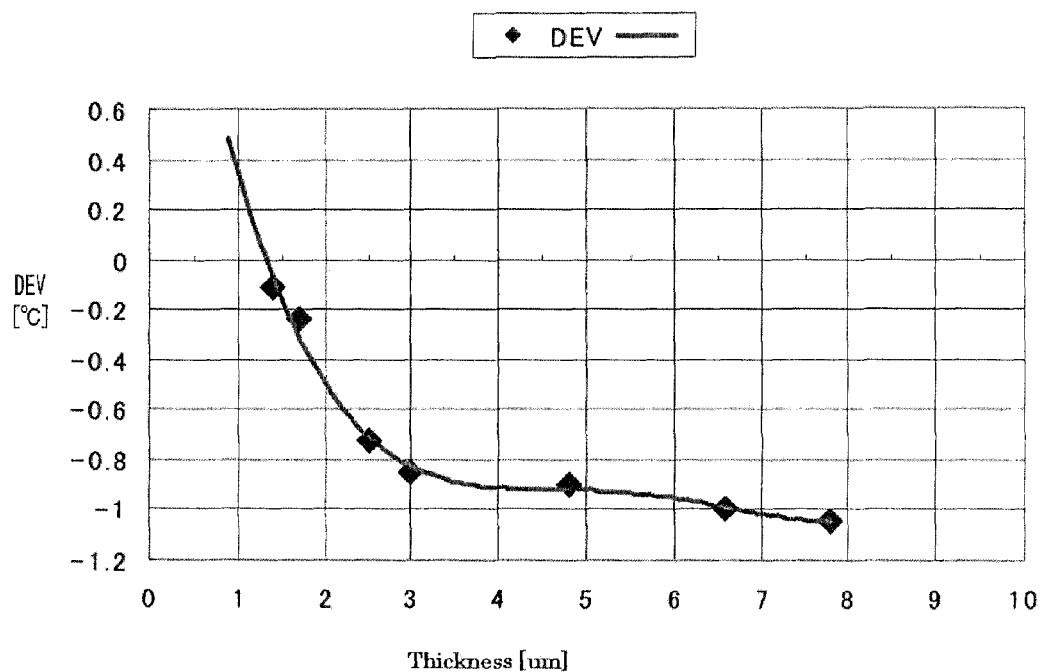
FIG. 8 is a view illustrating the relationship between temperature detected by the inner temperature sensor and accumulated film thickness of substances attached to the inner wall of the reaction tube after 30 minutes from the loading of the boat in FIG. 7.

FIG. 8 shows the relationship between the temperature detected by the inner temperature sensor 263a and the accumulated film thickness of substances attached to the C-zone of the inner wall of the reaction tube after 30 minutes from the loading of the boat 217 in FIG. 7. In FIG. 8, the vertical axis denotes temperature deviation (° C.) from the set temperature, and the horizontal axis denotes film thickness (μm). As shown in FIG. 8, when the film thickness ranges from 1.4 μm to 3.0 the temperature decreases by up to about 0.8° C. with a first gradient, and when the film thickness is greater than 3 μm but equal to or smaller than 7.8 μm, the temperature further decreases by up to about 0.2° C. with a gradient less steeper than the first gradient and approaches about −1.0° C.

Figure 9:
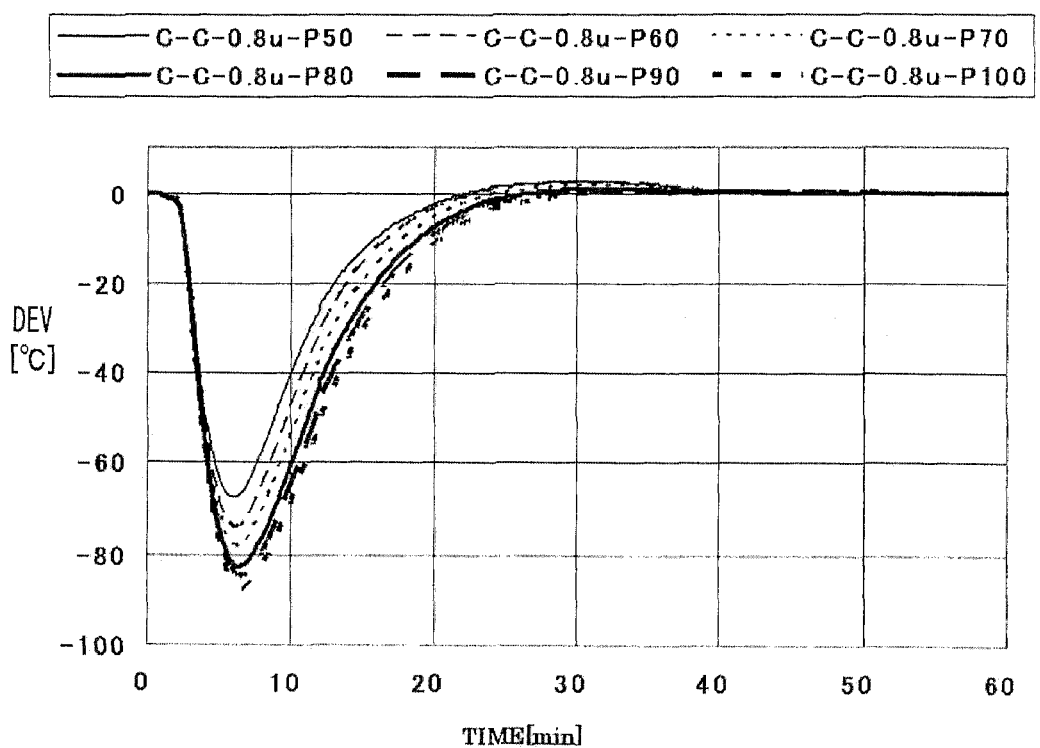
FIG. 9 is a graph illustrating temperature waveforms detected by using the inner temperature sensor in a state where it is controlled by adding a correction value is added to a P constant.

FIG. 9 is a graph showing temperature waveforms, which were detected by using the inner temperature sensor 263a disposed at the C-zone where product wafers were located when the boat in which substrates (wafers) were placed was carried into (hereinafter, referred to as "loaded into") the reaction tube. The temperature waveforms of FIG. 9 were detected when it is controlled by adding a P constant correction value a base P constant. The accumulated film thickness of substances attached to the inner wall of the reaction tube was constant at 0.8 μm. In FIG. 9, the left vertical axis denotes temperature deviation values (° C.) from a set temperature, and the horizontal axis denotes time (min).

As shown in FIG. 9, the temperature waveforms were detected by the inner temperature sensor 263a when the P constant was 50% (C-C-0.8μ-P50), 60% (C-C-0.8μ-P60), 70% (C-C-0.8μ-P70), 80% (C-C-0.8μ-P80), 90% (C-C-0.8μ-P90), and 100% (C-C-0.8μ-P100). The temperature of the heater 207 was set to 530° C., and the temperature waveforms were detected from the start of a boat-up step (0 min) to the end of the boat-up step (60 min).

Figure 10:
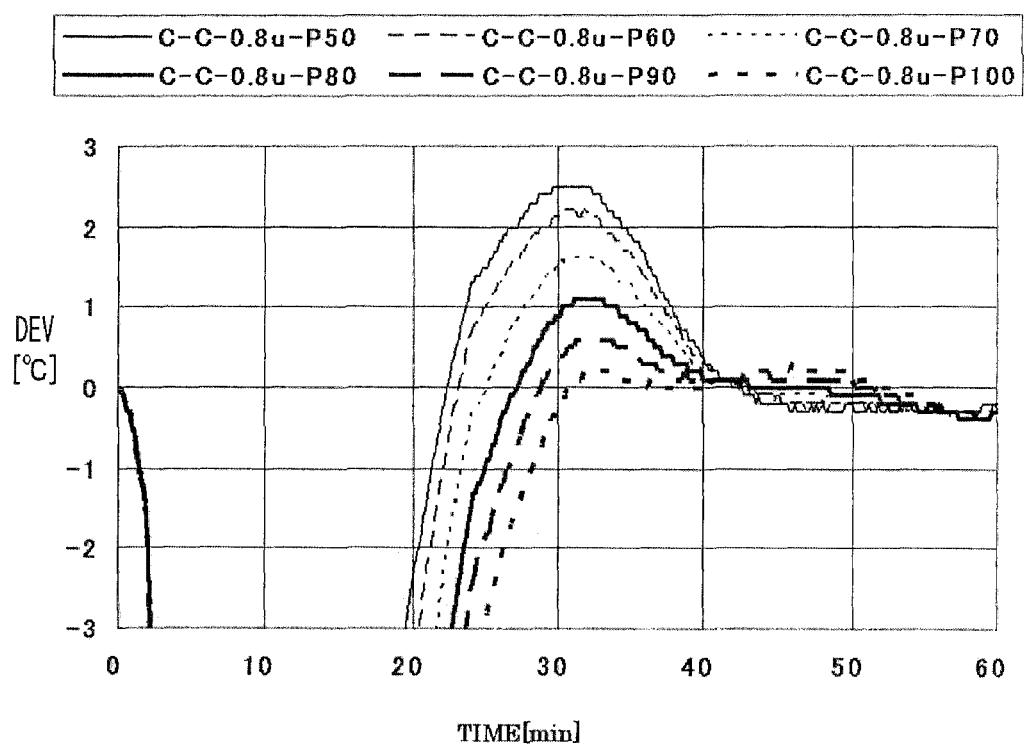
FIG. 10 is an enlarged view of the temperature waveforms of FIG. 9, showing a region close to 530° C.

FIG. 10 is an enlarged view of the temperature waveforms of FIG. 9, showing a region close to 530° C. As shown in FIG. 10, after 40 minutes from the start of the boat-up step, the temperature detected by the inner temperature sensor 263a is stabilized within an error range of 1° C. from the set temperature.

Figure 11:
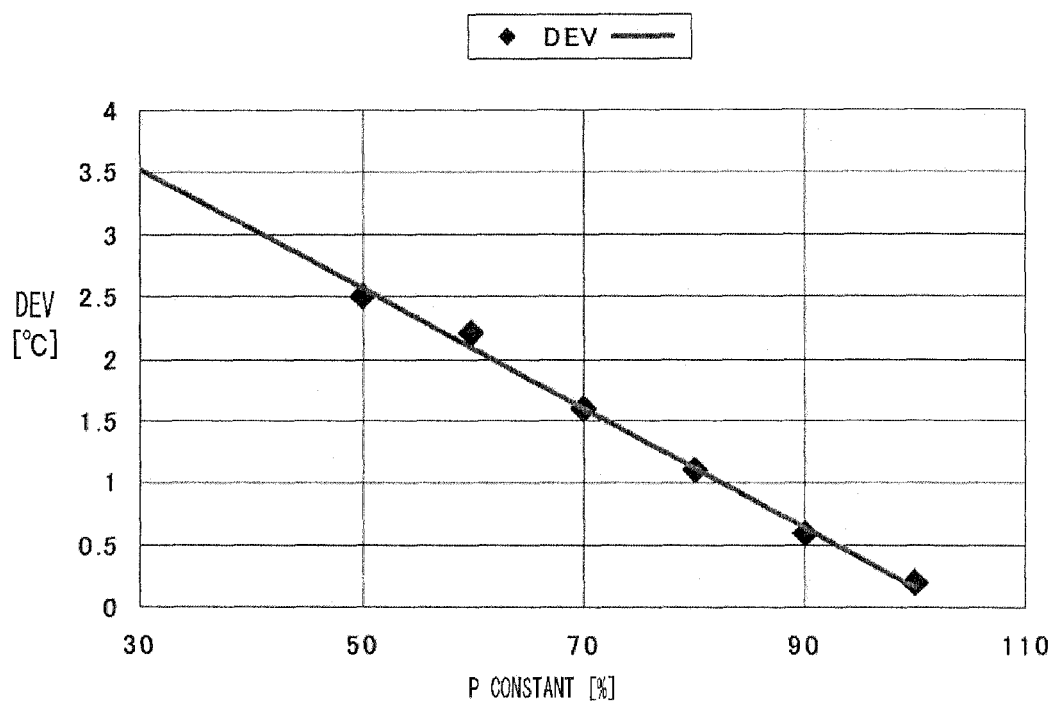
FIG. 11 is a view illustrating the relationship between the temperature detected by the inner temperature sensor and the P constant after 30 minutes from the loading of the boat in FIG. 10.

FIG. 11 shows the relationship between the temperature detected by the inner temperature sensor 263a and the P constant at the C-zone after 30 minutes from the loading of the boat 217 in FIG. 10. In FIG. 11, the vertical axis denotes temperature deviation (° C.) from the set temperature, and the horizontal axis denotes percentage (%). As shown in FIG. 11, if the P constant is increased, the temperature waveform detected by the inner temperature sensor 263a is decreased. That is, if the P constant is increased, the temperature of the process chamber 201 is decreased. On the other hand, if the P constant is decreased, the temperature waveform detected by the inner temperature sensor 263a is increased. That is, the temperature of the process chamber 201 is increased. In detail, as shown in FIG. 11, when the P constant is 50%, the temperature is greater than the set temperature by 2.5° C., and when the P constant is 90%, the temperature is greater than the set temperature by 0.5° C. If the P constant is increased by 10%, the temperature is decreased by about 0.5° C., and if the P constant is decreased by 10%, the temperature is increased by about 0.5° C.

Figures 12, 13:
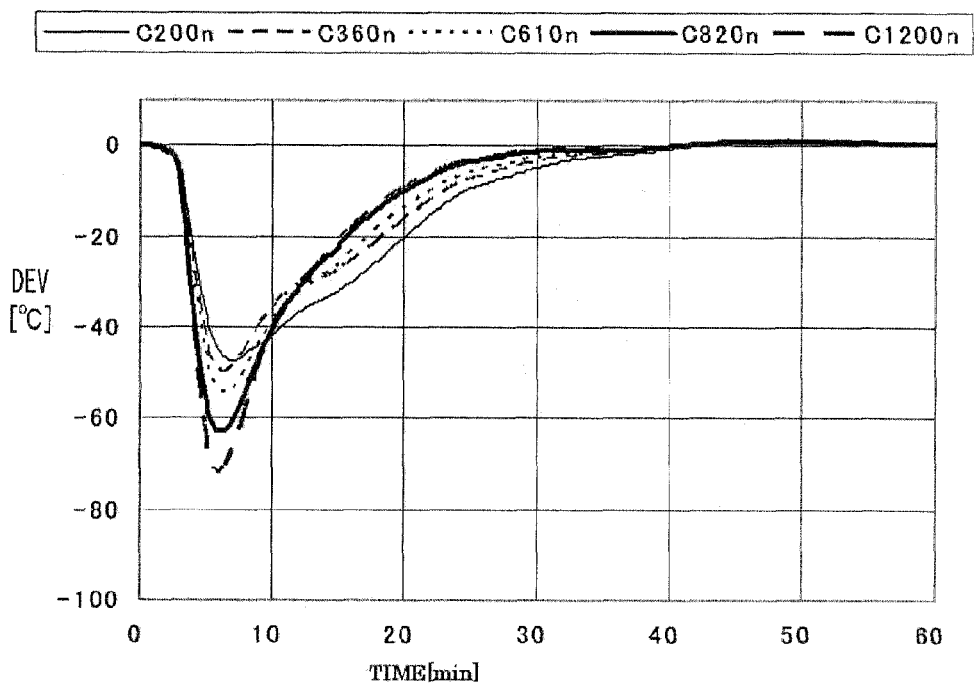
FIG. 12 is a table illustrating correction values of a reaction tube accumulated film thickness calculation parameter setting unit.
FIG. 13 is a graph illustrating temperature waveforms detected when the boat is loaded by the inner temperature sensor for different accumulated film thicknesses on filler wafers.

Calculation parameter correction values, which are set at the reaction tube accumulated film thickness calculation parameter setting unit 42 based on the facts explained in FIG. 7 and FIG. 8, are shown in FIG. 12.

In FIG. 12, a base P constant is determined, and correction values for the P constant are set according to accumulated film thicknesses on the inner wall of the reaction tube. Here, the base P constant is set to 50%. The base P constant is set to 50%, so that when a correction value is set for the base P constant, the correction value can be maximized in both upper and lower directions.

As described in FIG. 11, since a 0.5° C. temperature drop is caused when the P constant (calculation parameter) is increased by 10%, the correction value is set to 20% in the range where the film thickness on the inner wall of the reaction tube is greater than 0 micrometer but smaller than 1.5 micrometers. In the range where the film thickness is equal to or greater than 1.5 micrometers but smaller than 3.0 micrometers, the correction value is set to 10%. In the range where the film thickness is equal to or greater than 3.0 micrometers but smaller than 10 micrometers, the correction value is set to 0%. In the range where the film thickness is equal to or greater than 10 micrometers, the correction value is set to 0%.

Correction values are set for the CU-zone and CL-zone in the same manner as for the C-zone, and the correction values are set and stored in the reaction tube accumulated film thickness calculation parameter setting unit 42. Correction values for the U-zone and the L-zone are 0% because product wafers are not placed in the U-zone and the L-zone and it is less necessary to use correct values for the U-zone and the L-zone. However, correction values can be set for the U-zone and the L-zone as in the case of the C-zone.

FIG. 13 a graph showing temperature waveforms detected by using the inner temperature sensor disposed at the C-zone where product wafers were located when the boat in which substrates (wafers) were placed was loaded into the reaction tube, the temperature waveforms being detected for different accumulated film thicknesses of substances attached to the inner wall of the reaction tube in a condition where the reaction tube accumulated film thickness calculation parameter setting unit 42, the filler wafer accumulated film thickness calculation parameter setting unit 43, and the filler wafer number calculation coefficient setting unit 44 are not used. In FIG. 13, the left vertical axis denotes temperature deviation values (° C.) from a set temperature, and the horizontal axis denotes time (min). The temperature waveforms were detected by using the inner temperature sensor 263a when the accumulated film thicknesses of substances attached to the C-zone of the inner wall of the reaction tube were 200 nanometers (C200 n), 360 nanometers (C360 n), 610 nanometers (C610 n), 820 nanometers (C820 n), and 1200 nanometers (C1200 n). The temperature of the heater 207 was set to 530° C., and the temperature waveforms were detected from the start of a boat-up step (0 min) to the end of the boat-up step (60 min).

Figure 14:
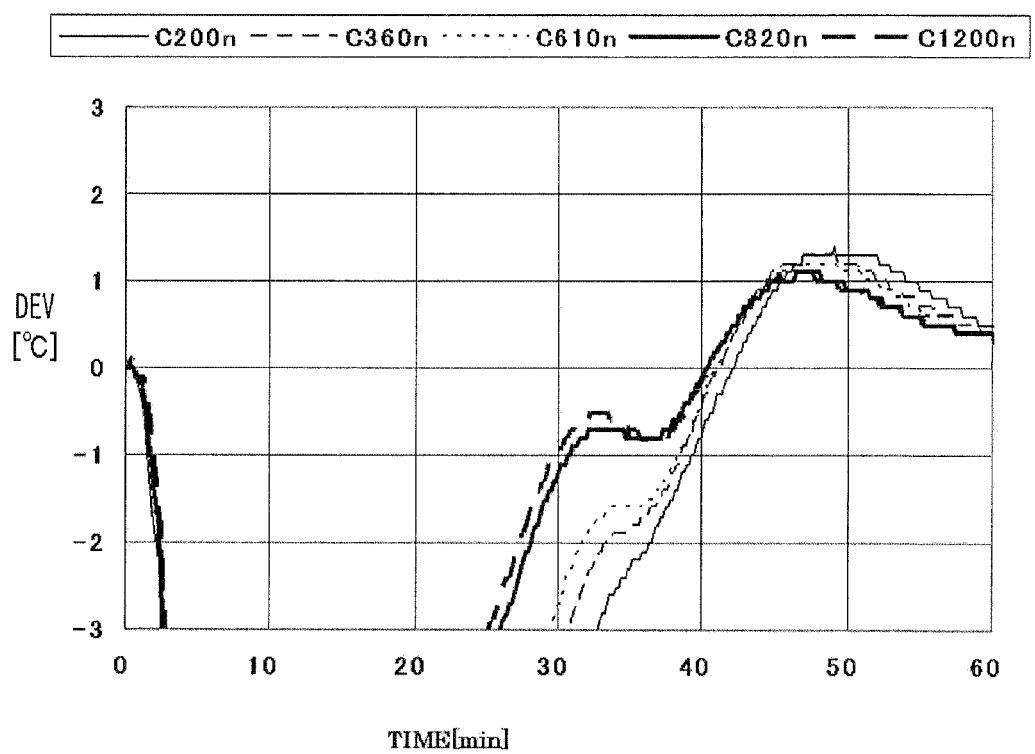
FIG. 14 is an enlarged view of the temperature waveforms of FIG. 13, showing a region close to 530° C.

FIG. 14 is an enlarged view of the temperature waveforms of FIG. 13, showing a region close to 530° C. As shown in FIG. 14, before 55 minutes from the start of the boat-up step, the temperature detected by the inner temperature sensor 263a is not stabilized within an error range of 1° C. from the set temperature, and as the accumulated film thickness of attached substances increases, the temperature detected by the inner temperature sensor 263a is increased.

Figures 15, 16:
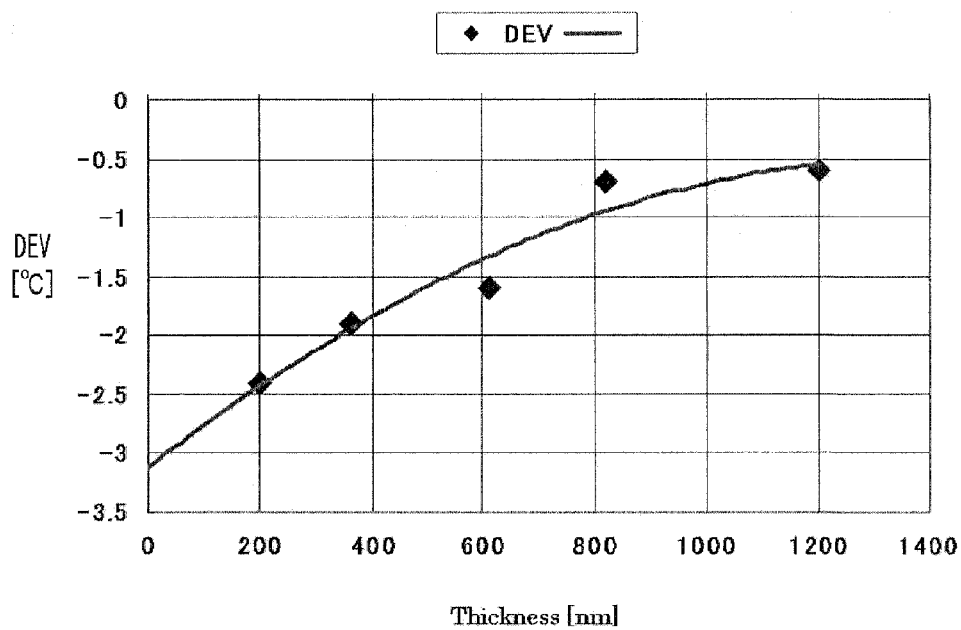
FIG. 15 is a view illustrating the relationship between temperature detected by the inner temperature sensor and accumulated film thickness of substances attached to the filler wafers after 30 minutes from the loading of the boat in FIG. 14.
FIG. 16 is a table illustrating correction values of a filler wafer accumulated film thickness calculation parameter setting unit.

FIG. 15 shows the relationship between the temperature detected by the inner temperature sensor 263a and the accumulated film thickness of substances attached to the C-zone of the inner wall of the reaction tube after 30 minutes from the loading of the boat 217 in FIG. 14.

In FIG. 15, the vertical axis denotes temperature deviation (° C.) from the set temperature, and the horizontal axis denotes film thickness (μm). As shown in FIG. 15, when the film thickness increases up to 120 nanometers, the temperature increases up to about −0.5° C. with a first gradient.

Calculation parameter correction values, which are set at the filler wafer accumulated film thickness calculation parameter setting unit 43 based on the facts explained in FIG. 14 and FIG. 15, are shown in FIG. 16.

In FIG. 16, a base P constant is determined, and correction values for the P constant are set according to accumulated film thicknesses on filler wafers. Here, the base P constant is set to 50%. The base P constant is set to 50% so that when a correction value is set for the base P constant, the correction value can be maximized in both upper and lower directions.

As described in FIG. 11, since a 0.5° C. temperature drop is caused when the P constant (calculation parameter) is increased by 10%, the correction value is set to 0% in the range where the film thickness on the filler wafers is greater than 0 nanometer but smaller than 150 nanometers. In the range where the film thickness is equal to or greater than 150 nanometers but smaller than 300 nanometers, the correction value is set to 10%. In the range where the film thickness is equal to or greater than 300 nanometers but smaller than 500 nanometers, the correction value is set to 20%. In the range where the film thickness is equal to or greater than 500 nanometers but smaller than 800 nanometers, the correction value is set to 30%. In the range where the film thickness is equal to or greater than 800 nanometers but smaller than 1200 nanometers, the correction value is set to 40%. Correction values are set for the CU-zone and CL-zone in the same manner as for the C-zone, and the correction values are set and stored in the filler wafer accumulated film thickness calculation parameter setting unit 43. Correction values for the U-zone and the L-zone are 0% because product wafers are not placed in the U-zone and the L-zone and it is less necessary to use correct values for the U-zone and the L-zone. However, correction values can be set for the U-zone and the L-zone as in the case of the C-zone.

Figures 17, 18:
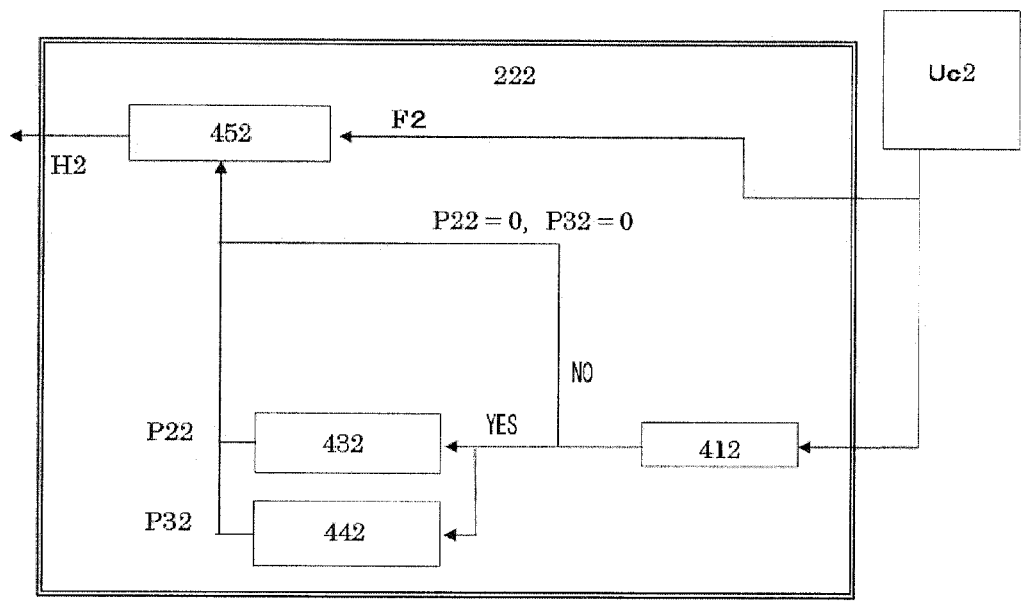
FIG. 17 is a table illustrating filler wafer number calculation coefficients of a filler wafer number calculation coefficient setting unit.
FIG. 18 is a functional block diagram illustrating a calculation parameter setting unit according to a second embodiment of the present invention.

Filler wafer number calculation coefficients (correction coefficients), which are set at the filler wafer number calculation coefficient setting unit 44 based on the facts explained in FIG. 14 and FIG. 15, are shown in FIG. 17. In FIG. 17, the filler wafer number calculation coefficients are expressed by percentage (%). If the number of filler wafers is equal to or greater than 1 but smaller than 25, the correction coefficient is set to 0%. If the number of filler wafers is equal to or greater than 25 but smaller than 50, the correction coefficient is set to 50%. If the number of filler wafers is equal to or greater than 50 but smaller than 75, the coefficient is set to 75%. If the number of filler wafers is equal to or greater than 75 but smaller than 100, the correction coefficient is set to 100%. Correction values (correction coefficients) are set for the CU-zone and CL-zone in the same manner as for the C-zone, and the correction values are set and stored in the filler wafer number calculation coefficient setting unit 44. Correction values for the U-zone and the L-zone are 0% because product wafers are not placed in the U-zone and the L-zone and it is less necessary to used correction coefficients for the U-zone and the L-zone. However, correction values can be set for the U-zone and the L-zone as in the case of the C-zone.

In addition, since filler wafers 200c are installed at product-wafer positions in the boat 217 if product wafers 200b are not placed at the product-wafer positions, the number of the filler wafers 200c may be varied according to process conditions such as the kind of a film forming process and the number of product wafers to be processed at once. However, although the number of filler wafers is varied by about one, the resultant thermal effect is not large. Therefore, it is preferable that a correction coefficient be set for a predetermined number range of filler wafers as described above, and in this case, the controlling operation may be easily performed.

Referring to FIG. 17, in the cases where the number of filler wafers is 50 and 75, correction coefficients for the CU-zone are different from correction coefficients for the C-zone and the CL-zone due to the following reason. It is assumed that filler wafers are placed at product-wafer positions in the boat 217 from the lowermost (bottom) product-wafer position. For example, when the number of filler wafers is 75, the correction coefficient is set to 75% for the C-zone and the CL-zone and 50% for the CU-zone. In this way, the correction coefficient is differently set according to the number of neighboring filler wafers.

According to the current embodiment, at least one of the following effects can be attained.

(1) Unlike product wafers, side dummy wafers or filler wafers are used while a batch process is repeated a plurality of times, and thus, substances attached to the side dummy wafers or the filler wafers may be easily accumulated. Particularly, since filler wafers are disposed closer to product wafers than side dummy wafers, the filler wafers have larger temperature effect on the product wafers. According to the current embodiment, particularly, the temperature effect of substances attached to the filler wafers can be reflected on the temperature controlling of the inside of the reaction tube, and thus wafers disposed at the other positions of the boat can be processed under uniform temperature conditions (between the wafers) so that films having more uniform thickness and quality can be formed.

(2) The temperature effect on product wafers by substances attached to filler wafers is varied according to the number of the filler wafers. Therefore in the current embodiment, particularly, the temperature effect by the number of filler wafers to which substances are attached is reflected on the temperature controlling of the inside of the reaction tube, and thus wafers disposed at the other positions of the boat can be processed under uniform temperature conditions (between the wafers) for more uniform film thickness and quality.

(3) As described above, the temperature characteristics of the inside of the reaction tube are differently affected by substances attached to the inner wall of the reaction tube and substances attached to the filler wafers. Therefore, according to the current embodiment, particularly, different settings are made according to the temperature effect of substances attached to the inner wall of the reaction tube and the temperature effect of substances attached to the filler wafers, respectively, and temperature controlling is performed according to the settings, so that wafer processing processes (batch processes) can be performed under uniform temperature conditions for more uniform film thickness and quality.

(4) As attached substances are accumulated, heat absorptance, transmittance, and reflectance of the inside of the reaction tube are varied, and thus the temperature characteristics of the reaction tube are varied. If the heating conditions of the heater are adjusted by varying the set temperature of the heater for counteracting such temperature characteristic variations of the inside of the reaction tube caused by accumulation of attached substances, eventually, the temperature of the reaction tube is stabilized to the set temperature of the heater, which is deviated from an ideal process temperature of a wafer heat treatment process. Therefore, film thickness or film quality may be varied among batches. However, if a constant used in calculation such as a P constant is varied, wafers can be heat-treated with no deviation between the actual heat treatment temperature of wafers and the ideal heat treatment temperature of wafers.

(5) Undesirable effect on temperature stability caused by accumulation of substances attached to the inside of the reaction tube can be reduced.

(6) Maintenance such as a self cleaning operation necessary due to accumulation of substances attached to the inside of the reaction tube can be less frequently performed, and the rate of operation of a heat treatment apparatus can be improved.

Second Embodiment

With reference to FIG. 18, the second embodiment will now be described. The second embodiment is the same as the first embodiment except that a reaction tube accumulated film thickness calculation parameter setting unit is not installed in a calculation parameter setting unit 222. As shown in FIG. 18, the calculation parameter setting unit 222 includes a step ID determination unit 412, a filler wafer accumulated film thickness calculation parameter setting unit 432, a filler wafer number calculation parameter setting unit 442 (filler wafer number calculation coefficient setting unit 442), and a calculation parameter computing unit 452.

Next, the calculation parameter computing unit 452 will now be explained.

The calculation parameter computing unit 452 calculates a calculation parameter correction value PA from a filler wafer calculation parameter correction value P22 and a filler wafer number calculation coefficient P32 that are received from the filler wafer accumulated film thickness calculation parameter setting unit 432 and the filler wafer number calculation coefficient setting unit 442, respectively; and the calculation parameter computing unit 452 determines a calculation parameter H2 according to a calculation parameter F2 received from an upper controller Uc2. The calculation parameter H2 is used for PID calculation.

As expressed by Equation (8) below, the calculation parameter correction value PA is calculated by multiplying the filler wafer calculation parameter correction value P22 by the filler wafer number calculation coefficient P32. The calculation parameter H2 used for PID calculation is calculated as expressed by Equation (9). In Equation (8), F2 is a P constant input by the upper controller Uc2, and the calculation parameter H2 is calculated as the sum of the calculation parameter correction value PA calculated by Equation (8) and the P constant F2.

$$PA = P22 \cdot P32 \quad (8)$$

$$H2 = F2 + PA \quad (9)$$

According to the current embodiment, the temperature effect on the inside of the reaction tube by substances attached to the reaction tube cannot be controlled unlike the first embodiment. However, in other aspects, the same effects as those in the first embodiment can be attained.

Modified Example

According to the above-described second embodiment, the calculation parameter computing unit 452 can be used in other processes as well as a film forming process. For example, the calculation parameter computing unit 452 can also be used in a heat treatment apparatus such as an annealing apparatus, which is used for heat treatment in which a film is not accumulated on a reaction tube. In this case, for example, a filler wafer calculation parameter correction value P22 output from the filler wafer accumulated film thickness calculation parameter setting unit 432 may be used for a controlling operation under the assumption that films are accumulated on filler wafers 200c regardless of the number of heat treatment processes. Specifically, the filler wafer calculation parameter correction value P22 may be set to a fixed value, for example, a correction value 0%, and a base P constant may be set to 50%. In other words, a calculation parameter correction value is determined based on whether a filler wafer is used or not used. Meanwhile, it is set that the filler wafer number calculation coefficient P32 output from the filler wafer number calculation coefficient setting unit 442 is varied according to the number of filler wafers 200c like in the case of the second embodiment. Owing to this settings, regardless of the accumulated film thickness on filler wafers 200c or the number of heat treatment processes, the thermal effects on the inside of the reaction tube accumulated film thickness ranges by the thermal capacity of filler wafers and the number of the filler wafers can be counteracted.

Other Embodiments

In the second embodiment, the reaction tube accumulated film thickness calculation parameter setting unit used in the first embodiment is not installed in the calculation parameter setting unit. However, in the calculation parameter setting unit of the first embodiment, for example, the reaction tube accumulated film thickness calculation parameter setting unit may be installed but the filler wafer accumulated film thickness calculation parameter setting unit and the filler wafer number calculation parameter setting unit may be not installed. In this case, the temperature effect of substances attached to filler wafers on the inside of the reaction tube cannot be controlled; however, in other aspects, the same effects as those in the first embodiment can be attained.

In the above-described embodiments, the calculation parameter setting unit is suitable for setting a P calculation parameter for the PID calculator 23. The reason for this is that variations of temperature characteristics caused by accumulated film thickness are large in a temperature transition period but not significant in a temperature stable period because they are largely affected by heat absorption. Since an operation proportional to the temperature deviation between a set temperature and a temperature measured by the inner temperature sensor 263a is dominant in the temperature transition period, it is effective that the present invention is applied to P calculation parameter correction. However, the present invention can be applied to I (integral) operation or D (derivative) operation, and in this case, certain degrees of effects can be attained.

In addition, the present invention can be applied to calculation parameters used for the PID calculator 25, and certain degrees of effects can be attained.

In the above-described embodiments, the calculation parameter setting unit uses both the PID calculator 23 and the PID calculator 25. However, instead of using two PID calculators, only one of the PID calculators may be used. In addition, any other calculator than a PID calculator may be used.

Furthermore, although it is described that the inner temperature sensor and the outer temperature sensor are used, the present invention can be applied to the case where only one of the two temperature sensors is installed.

In addition, in the above-described embodiments, the reaction tube 203 has a double-tube structure formed by the inner tube 204 and the outer tube 205; however, the reaction tube 203 can have a single-tube structure formed only by the outer tube 205 without the inner tube 204, or the reaction tube 203 can have a triple or more tube structure. Furthermore, although it is described that the reaction vessel is formed by the reaction tube 203 and the manifold 209, the reaction vessel may be formed by making the reaction tube 203 and the manifold 209 in one piece.

The upper controller Uc or Uc2 may be installed separately from the substrate processing apparatus, or in the main control unit 120 or the temperature control unit 121.

In the above-described embodiments, it is described that the filler wafer accumulated film thickness calculation parameter setting unit 43 and the filler wafer number calculation coefficient setting unit 44 are used for only filler wafers 200c. However, like the filler wafers 200c, if upper side dummy wafers 200a, lower side dummy wafers 200d, or substances attached to the upper and lower side dummy wafers 200a and 200d have large temperature effect on product wafers 200b, the upper side dummy wafers 200a, the lower side dummy wafers 200d, or the upper and lower side dummy wafers 200a and 200d can be considered as the filler wafers 200c so as to control the number or accumulated film thickness of the upper side dummy wafers 200a, the lower side dummy wafers 200d, or the upper and lower side dummy wafers 200a and 200d by using the filler wafer accumulated film thickness calculation parameter setting unit 43 and the filler wafer number calculation coefficient setting unit 44. In this case, the upper side dummy wafers 200a, the lower side dummy wafers 200d, or the upper and lower side dummy wafers 200a and 200d are substantially treated as the filler wafers 200c in the above-described embodiments.

In the above-described embodiments, the step ID determination unit 41 may be not installed. In this case, it may not be determined whether the reaction tube accumulated film thickness calculation parameter setting unit 42, the filler wafer accumulated film thickness calculation parameter setting unit 43, and the filler wafer number calculation coefficient setting unit 44 are used according to a preset step ID. However, except for this, the same effects as the case where the step ID determination unit 41 is installed can be obtained.

In addition, automatic adjustment to optimal manipulation values can be carried out by repeating the above-described temperature control method several times. Furthermore, the above-described temperature control method may be programmed and provided in a computer.

Furthermore, although the present invention is applied to a vertical type apparatus in the above-described embodiments, the present invention is not limited to the vertical type apparatus. For example, the present invention can be applied to other apparatuses such as a single wafer type apparatus and a horizontal type heat treatment apparatus.

As described above, the present invention provides a substrate processing apparatus, a semiconductor device manufacturing method, and a temperature controlling method, which can contribute to reduction of heat treatment time and improvement of the operational rate of equipment.

(Supplementary Note)

The present invention also includes the following embodiments.

(Supplementary Note 1)

According to a preferred embodiment of the present invention, there is provided a substrate processing apparatus comprising: a reaction vessel configured to accommodate at least a product wafer and a filler wafer; a heating unit configured to heat an inside of the reaction vessel; a temperature detector configured to detect a temperature at an inside of the heating unit; and a control device configured to perform a calculation by using a deviation between a set temperature and the temperature detected by the temperature detector and at least one calculation parameter so as to control the heating unit by using a result of the calculation, wherein the control device comprises a calculation parameter setting unit configured to determine the calculation parameter, wherein the calculation parameter setting unit comprises: a first calculation parameter setting unit configured to determine a first calculation parameter correction value based on an accumulated film thickness on the reaction vessel; a second calculation parameter setting unit configured to determine a second calculation parameter correction value based on an accumulated film thickness on the filler wafer; a third calculation parameter setting unit configured to determines a third calculation parameter correction value based on the number of the filler wafers; and a calculation parameter computing unit configured to compute the calculation parameter by using at least the first calculation parameter correction value, the second calculation parameter correction value, and the third calculation parameter correction value.

(Supplementary Note 2)

In the substrate processing apparatus of Supplementary Note 1, wherein the control device may be configured to perform the calculation by using a PID (proportional-integral-derivative) calculator to obtain the result.

(Supplementary Note 3)

In the substrate processing apparatus of Supplementary Note 1, wherein the set temperature may be a temperature of the inside of the reaction vessel when the product wafer and the filler wafer are accommodated in the reaction vessel.

(Supplementary Note 4)

In the substrate processing apparatus of Supplementary Note 1, wherein the calculation parameter computing unit may be configured to compute the calculation parameter at least by multiplying the second calculation parameter correction value by the third calculation parameter correction value.

(Supplementary Note 5)

In the substrate processing apparatus of Supplementary Note 1, wherein a plurality of film thickness ranges may be provided in the first calculation parameter setting unit according to the accumulated film thickness on the reaction vessel, and correction values corresponding to the respective film thickness ranges may be previously set in the first calculation parameter setting unit.

(Supplementary Note 6)

In the substrate processing apparatus of Supplementary Note 1, wherein a plurality of film thickness ranges may be provided in the second calculation parameter setting unit according to the accumulated film thickness on the filler wafer, and correction values corresponding to the respective film thickness ranges may be previously set in the second calculation parameter setting unit.

(Supplementary Note 7)

In the substrate processing apparatus of Supplementary Note 1, wherein a plurality of number ranges may be provided in the third calculation parameter setting unit according to the number of the filler wafers, and correction values corresponding to the respective number ranges may be previously set in the third calculation parameter setting unit.

(Supplementary Note 8)

In the substrate processing apparatus of Supplementary Note 1, wherein a plurality of film thickness ranges may be provided in the first calculation parameter setting unit according to the accumulated film thickness on the reaction vessel, and correction values corresponding to the respective film thickness ranges may be previously set in the first calculation parameter setting unit in a manner such that the correction values increase as the corresponding film thickness ranges increase.

(Supplementary Note 9)

In the substrate processing apparatus of Supplementary Note 1, wherein a plurality of film thickness ranges may be provided in the second calculation parameter setting unit according to the accumulated film thickness on the filler wafer, and correction values corresponding to the respective film thickness ranges may be previously set in the second calculation parameter setting unit in a manner such that the correction values decrease as the corresponding film thickness ranges increase.

(Supplementary Note 10)

In the substrate processing apparatus of Supplementary Note 1, wherein a plurality of number ranges may be provided in the third calculation parameter setting unit according to the number of the filler wafers, and correction values corresponding to the respective number ranges may be previously set in the third calculation parameter setting unit in a manner such that the correction values increase as the corresponding number ranges increase.

(Supplementary Note 11)

According to another preferred embodiment of the present invention, there is provided a substrate processing apparatus comprising: a reaction vessel configured to accommodate at least a product wafer and a filler wafer; a heating unit configured to heat an inside of the reaction vessel; a first temperature detector configured to detect a temperature of the heating unit; a second temperature detector disposed closer to the product wafer and the filler wafer than the first temperature detector and configured to detect a temperature at an inside of the heating unit; and a control device configured to perform a first calculation by using a first deviation between a set temperature and the temperature detected by the second temperature detector and at least one first calculation parameter, and to perform a second calculation by using a second deviation between a result of the first calculation and the temperature detected by the first temperature detector and at least one second calculation parameter, so as to control the heating unit by using a result of the second calculation, wherein the control device comprises a calculation parameter setting unit configured to determine the first calculation parameter, wherein the calculation parameter setting unit comprises: a first calculation parameter setting unit configured to determine a first calculation parameter correction value based on an accumulated film thickness on the reaction vessel; a second calculation parameter setting unit configured to determine a second calculation parameter correction value based on an accumulated film thickness on the filler wafer; a third calculation parameter setting unit configured to determines a third calculation parameter correction value based on the number of the filler wafers; and a calculation parameter computing unit configured to compute the first calculation parameter by using at least the first calculation parameter correction value, the second calculation parameter correction value, and the third calculation parameter correction value.

(Supplementary Note 12)

According to another preferred embodiment of the present invention, there is provided a substrate processing apparatus comprising: a reaction vessel configured to accommodate at least a product wafer and a filler wafer; a heating unit configured to heat an inside of the reaction vessel; a temperature detector configured to detect a temperature at an inside of the heating unit; and a control device configured to perform a calculation by using a deviation between a set temperature and the temperature detected by the temperature detector and at least one calculation parameter so as to control the heating unit by using a result of the calculation, wherein the control device comprises a calculation parameter setting unit configured to determine the calculation parameter, wherein the calculation parameter setting unit comprises: a filler wafer calculation parameter setting unit configured to determine a calculation parameter correction value based on at least an accumulated film thickness on the reaction vessel; a calculation coefficient setting unit configured to determine a calculation coefficient based on the number of the filler wafers; and a calculation parameter computing unit configured to compute the calculation parameter by using at least the calculation parameter correction value and the calculation coefficient.

(Supplementary Note 13)

According to another preferred embodiment of the present invention, there is provided a substrate processing apparatus comprising:

a reaction vessel configured to accommodate at least a product wafer and a filler wafer;

a heating unit configured to heat an inside of the reaction vessel;

a temperature detector configured to detect a temperature at an inside of the heating unit; and a control device configured to perform a calculation by using a deviation between a set temperature and the temperature detected by the temperature detector and at least one calculation parameter so as to control the heating unit by using a result of the calculation, wherein the control device comprises a calculation parameter setting unit configured to determine the calculation parameter, wherein the calculation parameter setting unit comprises:

a filler wafer calculation parameter setting unit configured to determine a calculation parameter correction value at least based on whether a filler wafer exists;

a calculation coefficient setting unit configured to determine a calculation coefficient based on the number of the filler wafers; and a calculation parameter computing unit configured to compute the calculation parameter by using at least the calculation parameter correction value and the calculation coefficient.

(Supplementary Note 14)

According to another preferred embodiment of the present invention, there is provided a semiconductor device manufacturing method comprising: computing a calculation parameter at a calculation parameter computing unit at least by using a first calculation parameter correction value which is determined by a first calculation parameter setting unit based on an accumulated film thickness on a reaction vessel, a second calculation parameter correction value which is determined by a second calculation parameter setting unit based on an accumulated film thickness on a filler wafer, and a third calculation parameter correction value which is determined by a third calculation parameter setting unit based on the number of filler wafers; and accommodating a product wafer and the filler wafer in the reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

(Supplementary Note 15)

According to another preferred embodiment of the present invention, there is provided a semiconductor device manufacturing method comprising:

computing a calculation parameter at a calculation parameter computing unit at least by using a calculation parameter correction value which is determined by a filler wafer calculation parameter setting unit based on an accumulated film thickness on a filler wafer, and a calculation coefficient which is determined by a calculation coefficient setting unit based on the number of filler wafers; and accommodating a product wafer and the filler wafer in a reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

(Supplementary Note 16)

According to another preferred embodiment of the present invention, there is provided a semiconductor device manufacturing method comprising:

computing a calculation parameter at a calculation parameter computing unit at least by using a calculation parameter correction value which is determined by a filler wafer calculation parameter setting unit based on whether a filler wafer exists, and a calculation coefficient which is determined by a calculation coefficient setting unit based on the number of filler wafers; and accommodating a product wafer and the filler wafer in a reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

(Supplementary Note 17)

According to another preferred embodiment of the present invention, there is provided a temperature controlling method comprising:

computing a calculation parameter at a calculation parameter computing unit at least by using a first calculation parameter correction value which is determined based on an accumulated film thickness on a reaction vessel, a second calculation parameter correction value which is determined based on an accumulated film thickness on a filler wafer, and a third calculation parameter correction value which is determined based on the number of filler wafers; and controlling a heating unit by using a result of a calculation performed by using at least the computed calculation parameter and a deviation between a set temperature and a temperature detected at an inside of the heating unit by a temperature detector.

(Supplementary Note 18)

According to another preferred embodiment of the present invention, there is provided a semiconductor device manufacturing method comprising:

computing a calculation parameter at a calculation parameter computing unit at least by using a first calculation parameter correction value which is determined based on an accumulated film thickness on a reaction vessel, a second calculation parameter correction value which is determined based on an accumulated film thickness on a filler wafer, and a third calculation parameter correction value which is determined based on the number of filler wafers; and accommodating a product wafer and the filler wafer in a reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

(Supplementary Note 19)

According to another preferred embodiment of the present invention, there is provided a semiconductor device manufacturing method comprising:

computing a calculation parameter at a calculation parameter computing unit at least by using a first calculation parameter correction value which is determined based on an accumulated film thickness on a filler wafer, and a second calculation parameter correction value which is determined based on the number of filler wafers; and accommodating a product wafer and the filler wafer in a reaction vessel and heat-treating the product wafer and the filler wafer while controlling a heating unit by using a result of a calculation performed by using at least the computed calculation parameter and a deviation between a set temperature and a temperature detected at an inside of the heating unit by a temperature detector.

What is claimed is:

1. A substrate processing apparatus comprising:
a reaction vessel configured to accommodate at least a product wafer and a filler wafer;
a heating unit configured to heat an inside of the reaction vessel;
a temperature detector configured to detect a temperature at an inside of the heating unit; and
a control device configured to perform a calculation by using a deviation between a set temperature and the temperature detected by the temperature detector and at least one calculation parameter so as to control the heating unit by using a result of the calculation,
wherein the control device comprises a calculation parameter setting unit configured to determine the calculation parameter,
wherein the calculation parameter setting unit comprises:
a first calculation parameter setting unit configured to determine a first calculation parameter correction value based on an accumulated film thickness on the reaction vessel;
a second calculation parameter setting unit configured to determine a second calculation parameter correction value based on an accumulated film thickness on the filler wafer;
a third calculation parameter setting unit configured to determines a third calculation parameter correction value based on the number of the filler wafers; and
a calculation parameter computing unit configured to compute the calculation parameter by using at least the first calculation parameter correction value, the second calculation parameter correction value, and the third calculation parameter correction value wherein the calculation parameter computing unit is configured to compute the calculation parameter at least by multiplying the second calculation parameter correction value by the third calculation parameter correction value.

2. The substrate processing apparatus of claim 1, wherein the control device is configured to perform the calculation by using a PID (proportional-integral-derivative) calculator to obtain the result.

3. The substrate processing apparatus of claim 1, wherein a plurality of film thickness ranges are provided in the first calculation parameter setting unit according to the accumulated film thickness on the reaction vessel, and correction values corresponding to the respective film thickness ranges are previously set in the first calculation parameter setting unit.

4. The substrate processing apparatus of claim 1, wherein a plurality of film thickness ranges are provided in the second calculation parameter setting unit according to the accumulated film thickness on the filler wafer, and correction values corresponding to the respective film thickness ranges are previously set in the second calculation parameter setting unit.

5. The substrate processing apparatus of claim 1, wherein a plurality of number ranges are provided in the third calculation parameter setting unit according to the number of the filler wafers, and correction values corresponding to the respective number ranges are previously set in the third calculation parameter setting unit.

6. The substrate processing apparatus of claim 1, wherein a plurality of film thickness ranges are provided in the first calculation parameter setting unit according to the accumulated film thickness on the reaction vessel, and correction values corresponding to the respective film thickness ranges are previously set in the first calculation parameter setting unit in a manner such that the correction values increase as the corresponding film thickness ranges increase.

7. The substrate processing apparatus of claim 1, wherein a plurality of film thickness ranges are provided in the second calculation parameter setting unit according to the accumulated film thickness on the filler wafer, and correction values corresponding to the respective film thickness ranges are previously set in the second calculation parameter setting unit in a manner such that the correction values decrease as the corresponding film thickness ranges increase.

8. The substrate processing apparatus of claim 1, wherein a plurality of number ranges are provided in the third calculation parameter setting unit according to the number of the filler wafers, and correction values corresponding to the respective number ranges are previously set in the third calculation parameter setting unit in a manner such that the correction values increase as the corresponding number ranges increase.

9. A substrate processing apparatus comprising:
a reaction vessel configured to accommodate at least a product wafer and a filler wafer;
a heating unit configured to heat an inside of the reaction vessel;
a first temperature detector configured to detect a temperature of the heating unit;
a second temperature detector disposed closer to the product wafer and the filler wafer than the first temperature detector and configured to detect a temperature at an inside of the heating unit; and
a control device configured to perform a first calculation by using a first deviation between a set temperature and the temperature detected by the second temperature detector and at least one first calculation parameter, and to perform a second calculation by using a second deviation between a result of the first calculation and the temperature detected by the first temperature detector and at least one second calculation parameter, so as to control the heating unit by using a result of the second calculation,
wherein the control device comprises a calculation parameter setting unit configured to determine the first calculation parameter,
wherein the calculation parameter setting unit comprises:
a first calculation parameter setting unit configured to determine a first calculation parameter correction value based on an accumulated film thickness on the reaction vessel;
a second calculation parameter setting unit configured to determine a second calculation parameter correction value based on an accumulated film thickness on the filler wafer;
a third calculation parameter setting unit configured to determines a third calculation parameter correction value based on the number of the filler wafers; and
a calculation parameter computing unit configured to compute the first calculation parameter by using at least the first calculation parameter correction value, the second calculation parameter correction value, and the third calculation parameter correction value wherein the calculation parameter computing unit is configured to compute the calculation parameter at least by multiplying the second calculation parameter correction value by the third calculation parameter correction value.

10. A substrate processing apparatus comprising:
a reaction vessel configured to accommodate at least a product wafer and a filler wafer;
a heating unit configured to heat an inside of the reaction vessel;
a temperature detector configured to detect a temperature at an inside of the heating unit; and
a control device configured to perform a calculation by using a deviation between a set temperature and the temperature detected by the temperature detector and at least one calculation parameter so as to control the heating unit by using a result of the calculation,
wherein the control device comprises a calculation parameter setting unit configured to determine the calculation parameter,
wherein the calculation parameter setting unit comprises:
a filler wafer calculation parameter setting unit configured to determine a first calculation parameter correction value based on at least an accumulated film thickness on the reaction vessel as well as a second calculation parameter correction value based on at least an accumulated film thickness on the filler wafer;
a calculation coefficient setting unit configured to determine a calculation coefficient based on the number of the filler wafers; and
a calculation parameter computing unit configured to compute the calculation parameter by using at least the calculation parameter correction value and the calculation coefficient wherein the calculation parameter computing unit is configured to compute the calculation parameter at least by multiplying the second calculation parameter correction value by the calculation coefficient.

11. The substrate processing apparatus of claim 10, wherein a plurality of film thickness ranges are provided in the calculation parameter setting unit according to the accumulated film thickness on the filler wafer, and correction values corresponding to the respective film thickness ranges are previously set in the calculation parameter setting unit.

12. The substrate processing apparatus of claim 10, wherein a plurality of film thickness ranges are provided in the calculation parameter setting unit according to the accumulated film thickness on the filler wafer, and correction values corresponding to the respective film thickness ranges are previously set in the calculation parameter setting unit in a manner such that the correction values decrease as the corresponding film thickness ranges increase.

* * * * *